US009972476B2

(12) United States Patent
Taki et al.

(10) Patent No.: US 9,972,476 B2
(45) Date of Patent: May 15, 2018

(54) FILM FORMING DEVICE, FILM FORMING METHOD, AND FILM FORMING PROGRAM

(71) Applicants: BROTHER KOGYO KABUSHIKI KAISHA, Nagoya-shi, Aichi-ken (JP); NATIONAL UNIVERSITY CORPORATION NAGOYA UNIVERSITY, Nagoya-shi, Aichi (JP)

(72) Inventors: Kazunari Taki, Nagoya (JP); Kentaro Shinoda, Nagoya (JP); Hideki Kanada, Toyohashi (JP); Hiroyuki Kousaka, Nagoya (JP); Yasuyuki Takaoka, Nagoya (JP)

(73) Assignees: BROTHER KOGYO KABUSHIKI KAISHA, Nagoya-Shi, Aichi-Ken (JP); NATIONAL UNIVERSITY CORPORATION NAGOYA UNIVERSITY, Nagoya-Shi, Aichi (JP)

( * ) Notice: Subject to any disclaimer, the term of this patent is extended or adjusted under 35 U.S.C. 154(b) by 0 days. days.

(21) Appl. No.: 14/862,722

(22) Filed: Sep. 23, 2015

(65) Prior Publication Data
US 2016/0013023 A1 Jan. 14, 2016

Related U.S. Application Data

(63) Continuation-in-part of application No. PCT/JP2014/057090, filed on Mar. 17, 2014.

(30) Foreign Application Priority Data

Mar. 28, 2013 (JP) .................................. 2013-069712

(51) Int. Cl.
C23C 16/00 (2006.01)
C23F 1/00 (2006.01)
(Continued)

(52) U.S. Cl.
CPC ........ H01J 37/32293 (2013.01); C23C 16/26 (2013.01); C23C 16/511 (2013.01);
(Continued)

(58) Field of Classification Search
CPC ....... C23C 16/26; C23C 16/52; C23C 16/511; H01J 37/32293; H01J 37/32266; H01J 2237/3321; H05H 1/46; H05H 2001/463
(Continued)

(56) References Cited

U.S. PATENT DOCUMENTS 4,996,079 A 2/1991 Itoh
5,310,452 A * 5/1994 Doki ........................ H05H 1/46
118/723 MP
(Continued)

FOREIGN PATENT DOCUMENTS

JP H01294867 A 11/1989
JP H02138476 A 5/1990
(Continued)

OTHER PUBLICATIONS

Machine Translation JP 2004047207, Kamisaka et al dt Feb. 12, 2004.*
(Continued)

Primary Examiner — Rakesh Dhingra
(74) Attorney, Agent, or Firm — Merchant & Gould P.C.

(57) ABSTRACT

A film forming device includes: a microwave supplying unit configured to supply microwaves for generating plasma along a treatment surface of a conductive workpiece; a negative voltage applying unit configured to apply to the workpiece a negative bias voltage for expanding a sheath layer thickness along the treatment surface of the workpiece, and a controller configured to control the microwave supplying unit and the negative voltage applying unit, wherein the microwave supplying unit has a microwave transmitting
(Continued)

window configured to propagate the supplied microwaves to the expanded sheath layer, wherein the controller is configured to control the microwave supplying unit and the negative voltage applying unit while supplying of the microwaves so that a sheath thickness of the sheath layer changes.

10 Claims, 15 Drawing Sheets

(51) Int. Cl.
  *H01L 21/306*  (2006.01)
  *H01J 37/32*  (2006.01)
  *C23C 16/511*  (2006.01)
  *C23C 16/52*  (2006.01)
  *H05H 1/46*  (2006.01)
  *C23C 16/26*  (2006.01)

(52) U.S. Cl.
  CPC ........ *C23C 16/52* (2013.01); *H01J 37/32266* (2013.01); *H05H 1/46* (2013.01); *H01J 2237/3321* (2013.01); *H05H 2001/463* (2013.01)

(58) Field of Classification Search
  USPC .............................. 118/715–733; 156/345.41
  See application file for complete search history.

(56) References Cited

U.S. PATENT DOCUMENTS

| | | | |
|---|---|---|---|
| 5,352,324 A | 10/1994 | Gotoh et al. | |
| 5,368,937 A | 11/1994 | Itoh | |
| 6,200,651 B1 | 3/2001 | Roche et al. | |
| 6,372,303 B1 | 4/2002 | Burger et al. | |
| 2002/0100420 A1 | 8/2002 | Burger et al. | |
| 2005/0098119 A1 | 5/2005 | Burger et al. | |
| 2007/0175587 A1 | 8/2007 | Saito et al. | |
| 2009/0255800 A1* | 10/2009 | Koshimizu | H01J 37/32165 204/164 |
| 2009/0286011 A1 | 11/2009 | Kousaka et al. | |
| 2009/0298287 A1* | 12/2009 | Shannon | H01J 37/32091 438/680 |
| 2015/0174605 A1 | 6/2015 | Shinoda et al. | |

FOREIGN PATENT DOCUMENTS

| | | | |
|---|---|---|---|
| JP | H06151360 A | 5/1994 | |
| JP | H06314660 A | 11/1994 | |
| JP | 8-260126 A | 10/1996 | |
| JP | 9-31655 A | 2/1997 | |
| JP | 2002--504189 A | 2/2002 | |
| JP | 2002-184770 A | 6/2002 | |
| JP | 2002212740 A | 7/2002 | |
| JP | 2003-003262 A | 1/2003 | |
| JP | 2004-047207 A | 2/2004 | |
| JP | 2004-238649 A | 8/2004 | |
| JP | 2006-111908 A | 4/2006 | |
| JP | 2007-194110 A | 8/2007 | |
| JP | 2009-070735 A | 4/2009 | |
| JP | 2012-233215 A | 11/2012 | |
| JP | 2013-155409 A | 8/2013 | |
| WO | 2008/010537 | 1/2008 | |

OTHER PUBLICATIONS

Japanese Office Action issued in related JP application No. 2013-069712, dated Sep. 6, 2016.
Japanese Office Action issued in related JP application No. 2012-197874, dated Sep. 12, 2016.
International Search Report issued in related PCT/JP2013/073996, dated Dec. 10, 2013 (8 pages).
International Search Report issued in related PCT/JP2014/057090, dated Jun. 17, 2014 (18 pages).
U.S. Appl. No. 14/638,170, filed Mar. 4, 2015.
Kishine et al. "High-Speed Deposition of Diamond-Lake Carbon on the Inner Wall of Metal Pipe by Using Surface Wave-Excited Plasma" Journal of IAPS vol. 14. Dec. 2006 (10 pages). English Abstract included.
Kousaka et al. "Internal DLC coating of narrow metal tubes using high-density near plasma sustained by microwaves propagating along plasma-sheath interfaces." Surface & Coatings Technology vol. 229, 2013, pp. 65-70.
Kousaka et al. "Study on speed-up of diamond-like carbon deposition to the inner wall of tube by using surface wave-excited plasma source." PST-08-30, 2008 pp. 25-28. English Abstract included.
International Preliminary Report on Patentability issued in related International Application No. PCT/JP2013/073996, dated Mar. 10, 2015.
International Preliminary Report on Patentability issued in related International Application No. PCT/JP2014/057090, dated Mar. 20, 2015.
English Translation of the International Search Report and Written Opinion issued in related PCT/JP2013/073996, dated Dec. 10, 2013.
English Translation of the International Search Report issued in related PCT/JP2014/057090, dated Jun. 17, 2014.
Office Action (Non-Final Rejection) issued in related U.S. Appl. No. 14/638,170, dated Nov. 2, 2017.

* cited by examiner

FIG. 10

| SEQUENCE | MICROWAVE OUTPUT (kW) | NEGATIVE BIAS VOLTAGE (V) |
|---|---|---|
| 1 | P1 | V1 |
| 2 | P2 | V2 |
| 3 | P3 | V3 |
| ⋮ | ⋮ | ⋮ |
| M-1 | PM-1 | VM-1 |
| M | PM | VM |

~55

FILM FORMING DEVICE, FILM FORMING METHOD, AND FILM FORMING PROGRAM

CROSS-REFERENCE TO RELATED APPLICATION

This application is a Continuation-in-Part of PCT/JP2014/057090, field Mar. 17, 2014, which claims benefit Japanese Patent Application No. 2013-069712 filed on Mar. 28, 2013, the entire subject matter of which are incorporated herein by reference.

TECHNICAL FIELD

The present invention relates to a film forming device, a film forming method, and a film forming program for forming a film on a surface of a conductive workpiece such as steel material by using plasma.

BACKGROUND ART

In the related art, a film forming device for forming a film on a surface of a conductive workpiece such as steel material by using plasma has been frequently suggested.

For example, the background art discloses a technology of forming a diamond-like carbon (hereinafter, referred to as 'DLC') film on the surface of the workpiece.

According to the technology disclosed in the background art, a plasma generating device is configured to supply microwaves towards a workpiece in a treatment chamber through a quartz window, which is a microwave transmitting window, thereby generating plasma in a peripheral area of an inner surface of the quartz window. The workpiece has a rod shape, for example, and is arranged to protrude from the inner surface of the quartz window into the treatment chamber, and a sheath layer is generated on the workpiece at the peripheral part of the inner surface of the quartz window covered by the generated plasma. Subsequently, the plasma generating device applies a negative bias voltage to the workpiece while supplying of the microwaves.

As a result, the thickness of the sheath layer formed on a surface of the workpiece expands along the surface of the workpiece. At the same time, the supplied microwaves propagate along the expanded sheath layer, as surface waves with a high energy density. At this time, the plasma and the sheath layer are also generated on the surface of the workpiece away from the periphery of the inner surface of the quartz window by the surface waves with a high energy density. The thickness of the newly generated sheath layer is also expanded by the negative bias voltage, and the microwaves further propagate along the expanded sheath layer, as the surface waves with a high energy density. Thereby, the plasma extends towards the part of the workpiece away from the periphery of the quartz window, i.e., towards the other end of the workpiece, which protrudes into the treatment chamber from one end of the workpiece facing the quartz window. As a result, a source gas is plasma-excited by the surface waves and becomes high density plasma, so that a DLC film is formed on the entire surface of the workpiece.

SUMMARY

However, according to the technology disclosed in the background art, the negative bias voltage applied to the workpiece is constant. Accordingly, a part of the microwaves propagating as the surface waves with a high energy density in the sheath layer is reflected at a side of the workpiece opposite to a microwave supply-side and becomes standing waves along a microwave propagation direction of the workpiece. As a result, a plasma density distribution corresponding to a standing wave distribution is generated in the high density plasma excited by the surface waves, so that film characteristics such as a film thickness, film hardness and the like are non-uniform.

The present invention provides a film forming device, a film forming method and a film forming program capable of uniformizing film characteristics of a film formed on a surface of a workpiece, such as a film thickness, film hardness and the like.

A film forming device of this disclosure includes: a microwave supplying unit configured to supply microwaves for generating plasma along a treatment surface of a conductive workpiece; a negative voltage applying unit configured to apply to the workpiece a negative bias voltage for expanding a sheath layer thickness along the treatment surface of the workpiece, and a controller configured to control the microwave supplying unit and the negative voltage applying unit, wherein the microwave supplying unit has a microwave transmitting window configured to propagate the supplied microwaves to the expanded sheath layer, wherein the controller is configured to control the microwave supplying unit and the negative voltage applying unit while supplying of the microwaves so that a sheath thickness of the sheath layer changes, wherein, while supplying of the microwaves by the microwave supplying unit, the controller controls the negative voltage applying unit so that the sheath thickness changes by changing a voltage value of the negative bias voltage to be applied to the workpiece, and wherein, while supplying of the microwaves by the microwave supplying unit, the controller controls the negative voltage applying unit so that negative bias voltages having a plurality of types of pulse shapes of which voltage values are different are sequentially applied to the workpiece to repeat expansion and reduction of the sheath thickness.

Meanwhile, a film forming device of this disclosure includes: a microwave supplying unit configured to supply microwaves for generating plasma along a treatment surface of a conductive workpiece; a negative voltage applying unit configured to apply to the workpiece a negative bias voltage for expanding a sheath layer thickness along the treatment surface of the workpiece, and a controller configured to control the microwave supplying unit and the negative voltage applying unit, wherein the microwave supplying unit has a microwave transmitting window configured to propagate the supplied microwaves to the expanded sheath layer, wherein the controller is configured to control the microwave supplying unit and the negative voltage applying unit while supplying of the microwaves so that a sheath thickness of the sheath layer changes, wherein, while supplying of the microwaves by the microwave supplying unit, the controller controls the negative voltage applying unit so that the sheath thickness changes by changing a voltage value of the negative bias voltage to be applied to the workpiece, and wherein, while supplying of the microwaves by the microwave supplying unit, the controller controls the negative voltage applying unit so that a voltage value of the negative bias voltage to be applied to the workpiece gradually changes every one or more pulses.

A film forming method to be executed by a film forming device comprising a microwave supplying unit configured to supply microwaves to a conductive workpiece through a microwave transmitting window, a negative voltage applying unit configured to apply a negative bias voltage to the workpiece and a controller configured to execute the film forming method, the film forming method includes: supplying microwaves for generating plasma along a treatment surface of the workpiece through the microwave transmitting window; applying to the workpiece a negative bias voltage for expanding a sheath layer thickness along the treatment surface of the workpiece through the negative voltage applying unit; propagating the microwaves supplied through the microwave transmitting window to the expanded sheath layer; and controlling the microwave supplying unit and the negative voltage applying unit, wherein the controller is configured to control the microwave supplying unit and the negative voltage applying unit while supplying of the microwaves so that a sheath thickness of the sheath layer changes, and wherein, while supplying of the microwaves by the microwave supplying unit, the controller controls the negative voltage applying unit so that the sheath thickness changes by changing a voltage value of the negative bias voltage to be applied to the workpiece, and wherein, while supplying of the microwaves by the microwave supplying unit, the controller controls the negative voltage applying unit so that negative bias voltages having a plurality of types of pulse shapes of which voltage values are different are sequentially applied to the workpiece to repeat expansion and reduction of the sheath thickness.

Meanwhile, a film forming method to be executed by a film forming device comprising a microwave supplying unit configured to supply microwaves to a conductive workpiece through a microwave transmitting window, a negative voltage applying unit configured to apply a negative bias voltage to the workpiece and a controller configured to execute the film forming method, the film forming method includes: supplying microwaves for generating plasma along a treatment surface of the workpiece through the microwave transmitting window; applying to the workpiece a negative bias voltage for expanding a sheath layer thickness along the treatment surface of the workpiece through the negative voltage applying unit; propagating the microwaves supplied through the microwave transmitting window to the expanded sheath layer; and controlling the microwave supplying unit and the negative voltage applying unit, wherein the controller is configured to control the microwave supplying unit and the negative voltage applying unit while supplying of the microwaves so that a sheath thickness of the sheath layer changes, and wherein, while supplying of the microwaves by the microwave supplying unit, the controller controls the negative voltage applying unit so that the sheath thickness changes by changing a voltage value of the negative bias voltage to be applied to the workpiece, and wherein, while supplying of the microwaves by the microwave supplying unit, the controller controls the negative voltage applying unit so that a voltage value of the negative bias voltage to be applied to the workpiece gradually changes every one or more pulses.

A non-transitory computer-readable medium having instructions to control a computer of a film forming device, the film forming device comprising a microwave supplying unit configured to supply microwaves to a conductive workpiece through a microwave transmitting window, and a negative voltage applying unit configured to apply a negative bias voltage to the workpiece, the instructions, when executed by the computer, control the computer to perform operations comprising: supplying microwaves for generating plasma along a treatment surface of the workpiece through the microwave transmitting window; applying to the workpiece a negative bias voltage for expanding a sheath layer thickness along the treatment surface of the workpiece through the negative voltage applying unit; propagating the microwaves supplied through the microwave transmitting window to the expanded sheath layer, and controlling the microwave supplying unit and the negative voltage applying unit, wherein the instructions causes the computer to control the microwave supplying unit and the negative voltage applying unit while supplying of the microwaves so that a sheath thickness of the sheath layer changes, wherein, while supplying of the microwaves by the microwave supplying unit, the controller controls the negative voltage applying unit so that the sheath thickness changes by changing a voltage value of the negative bias voltage to be applied to the workpiece, and wherein, while supplying of the microwaves by the microwave supplying unit, the controller controls the negative voltage applying unit so that negative bias voltages having a plurality of types of pulse shapes of which voltage values are different are sequentially applied to the workpiece to repeat expansion and reduction of the sheath thickness.

Meanwhile, a non-transitory computer-readable medium having instructions to control a computer of a film forming device, the film forming device comprising a microwave supplying unit configured to supply microwaves to a conductive workpiece through a microwave transmitting window, and a negative voltage applying unit configured to apply a negative bias voltage to the workpiece, the instructions, when executed by the computer, control the computer to perform operations comprising: supplying microwaves for generating plasma along a treatment surface of the workpiece through the microwave transmitting window; applying to the workpiece a negative bias voltage for expanding a sheath layer thickness along the treatment surface of the workpiece through the negative voltage applying unit; propagating the microwaves supplied through the microwave transmitting window to the expanded sheath layer, and controlling the microwave supplying unit and the negative voltage applying unit, wherein the instructions causes the computer to control the microwave supplying unit and the negative voltage applying unit while supplying of the microwaves so that a sheath thickness of the sheath layer changes, wherein, while supplying of the microwaves by the microwave supplying unit, the controller controls the negative voltage applying unit so that the sheath thickness changes by changing a voltage value of the negative bias voltage to be applied to the workpiece, and wherein, while supplying of the microwaves by the microwave supplying unit, the controller controls the negative voltage applying unit so that a voltage value of the negative bias voltage to be applied to the workpiece gradually changes every one or more pulses.

BRIEF DESCRIPTION OF THE DRAWINGS

The foregoing and additional features and characteristics of this disclosure will become more apparent from the following detailed descriptions considered with the reference to the accompanying drawings, wherein:

FIG. 10 shows an example of a driving voltage table that is to be stored in a ROM of a controller according to the first illustrative embodiment;

DETAILED DESCRIPTION OF ILLUSTRATIVE EMBODIMENTS

Hereinafter, first to sixth illustrative embodiments in which the film forming device of the present invention is implemented will be described in detail with reference to the drawings. First, a schematic configuration of a film forming device 1 according to the first illustrative embodiment will be described with reference to FIGS. 1 and 2.

First Illustrative Embodiment

Figure 1:
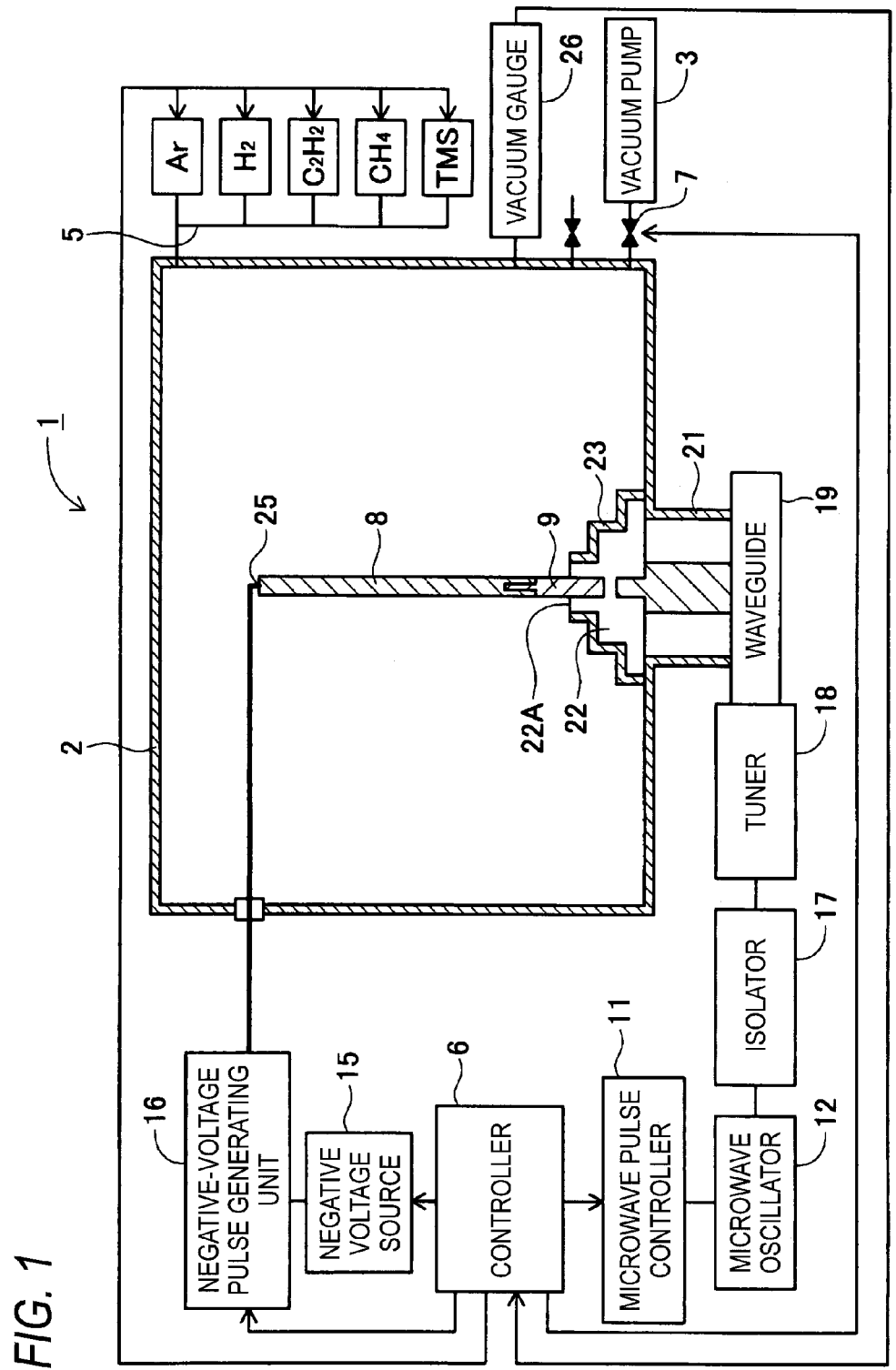
FIG. 1 illustrates a schematic configuration of a film forming device according to a first illustrative embodiment.
Figure 2:
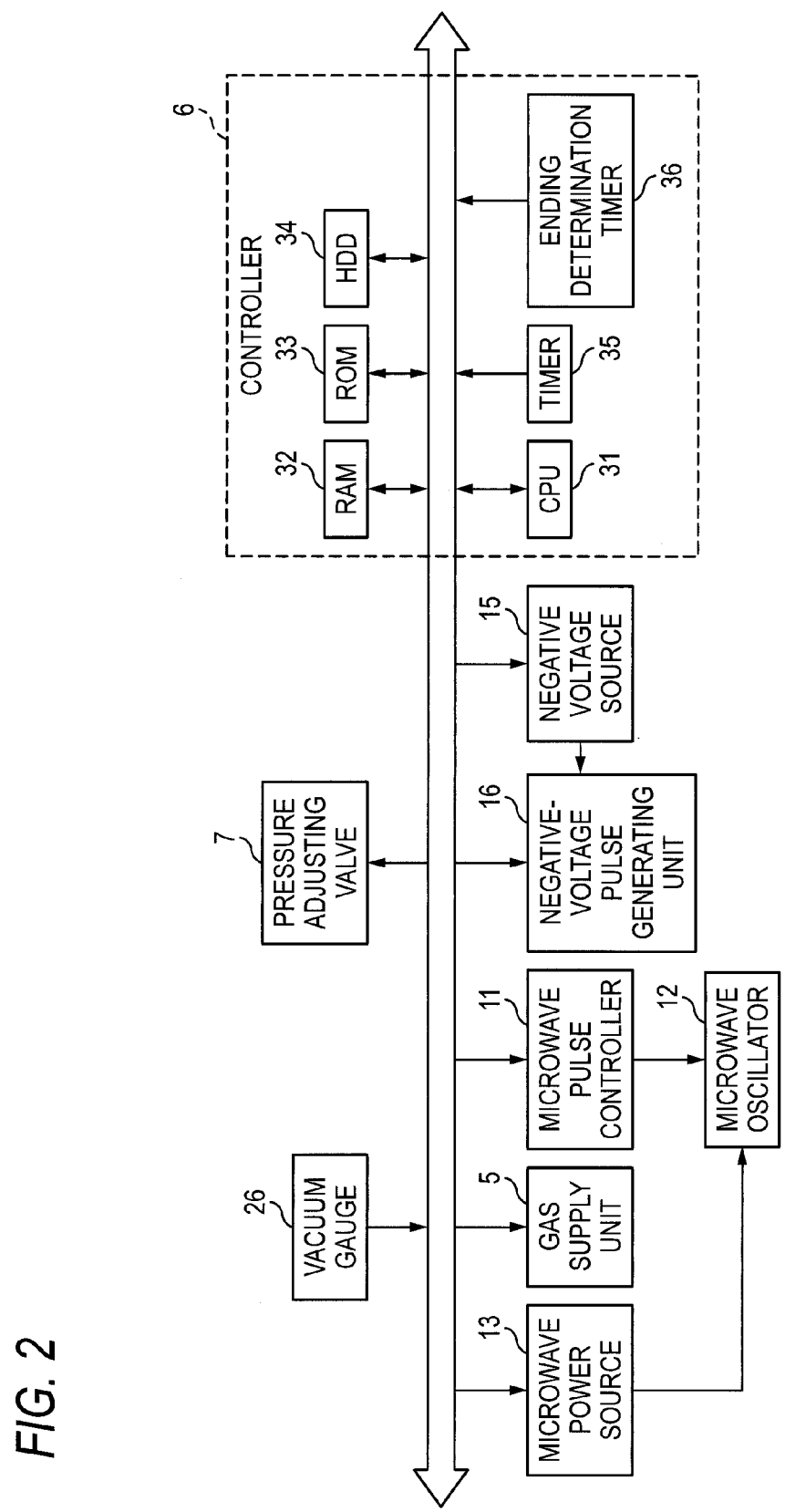
FIG. 2 is a block diagram showing an electrical configuration of the film forming device according to the first illustrative embodiment.

As shown in FIGS. 1 and 2, the film forming device 1 of the first illustrative embodiment includes a treatment chamber 2, a vacuum pump 3, a gas supply unit 5, a controller 6 and the like. The treatment chamber 2 is made of metal such as stainless steel and has an airtight structure. The vacuum pump 3 is a pump capable of evacuating an inside of the treatment chamber 2 through a pressure adjusting valve 7. In the treatment chamber 2, a conductive workpiece 8, which is a film formation target, is held by a conductive holder 9 made of stainless steel and the like.

The workpiece 8 is not particularly limited inasmuch as it has conductivity. In the first illustrative embodiment, low-temperature tempered steel is used. Here, the low-temperature tempered steel is a material such as JIS G4051 (Carbon steel for machine structural use), G4401 (Carbon tool steel), G44-4 (Steel for alloy tool) or maraging steel. As the workpiece, a material of which ceramic or resin is covered with a conductive material may be used, in addition to the low-temperature tempered steel.

The gas supply unit 5 is configured to supply a source gas for film formation and an inert gas into the treatment chamber 2. Specifically, the inert gas such as He, Ne, Ar, Kr, Xe and the like and the source gas such as $CH_4$, $C_2H_2$, TMS (tetramethylsilane) and the like are supplied. In the first illustrative embodiment, a DLC film is to be formed on the workpiece 8 by the source gas of $C_2H_2$, $CH_4$ and TMS.

Also, flow rates and pressures of the source gas and inert gas to be supplied from the gas supply unit 5 may be controlled by a CPU 31, which will be described later, or may be controlled by an operator. Also, the source gas may be a gas including a compound having a CH bonding such as alkine, alkene, alkane, aromatic compound and the like or a compound including carbons. Also, $H_2$ may be contained in the source gas.

Plasma is generated so as to form a DLC film on the workpiece 8 held in the treatment chamber 2. The plasma is generated by a microwave pulse controller 11, a microwave oscillator 12, a microwave power source 13 (refer to FIG. 2), a negative-voltage source 15 and a negative-voltage pulse generating unit 16. In the first illustrative embodiment, it will be described that the surface wave excited plasma is generated by a method disclosed in the background art (hereinafter, referred to as Microwave sheath-Voltage combination Plasma (MVP) method). In the below, the MVP method will be described.

The microwave pulse controller 11 is configured to oscillate a pulse signal and to supply the oscillated pulse signal to the microwave oscillator 12, in response to an instruction of the controller 6. The microwave oscillator 12 is configured to generate microwave pulses, in response to the pulse signal from the microwave pulse controller 11. The microwave power source 13 is configured to feed power to the microwave oscillator 12, which is configured to oscillate microwaves of 2.45 GHz with an instructed output. That is, the microwave oscillator 12 is configured to supply the microwaves of 2.45 GHz to an isolator 17 (which will be described later), as microwave pulses having a pulse shape, in response to the pulse signal from the microwave pulse controller 11.

The microwave pulses are supplied from the microwave oscillator 12 to the holder 9 and a treatment surface of the workpiece 8 via the isolator 17, a tuner 18, a waveguide 19, a coaxial waveguide 21 protruding from the waveguide 19 through a coaxial waveguide converter (not shown), and a microwave transmitting window 22 made of a dielectric and the like through which the microwaves penetrate, such as quartz. The isolator 17 is provided so as to suppress reflected waves of the microwaves from returning to the microwave oscillator 12. The tuner 18 is configured to adjust impedances before and after the tuner 18 so as to minimize the reflected waves of the microwaves.

An outer periphery of the microwave transmitting window 22 except for an upper end surface 22A is covered with a side electrode 23 made of metal such as stainless steel. The side electrode 23 is fixed to an inner surface of the treatment chamber 2 by screwing and the like, and is electrically connected to the treatment chamber 2. A central conductor of the coaxial waveguide 21 extends to a center of the microwave transmitting window 22. The holder 9 is also positioned on an extension line of the central conductor and becomes a central conductor in the microwave transmitting window 22. Therefore, the central conductor of the microwave transmitting window 22 and the side electrode 23 function as the coaxial waveguide.

Accordingly, the microwaves are propagated to the vicinity of the upper end surface 22A, at which the holder 9 is provided, by the microwave pulses supplied to the microwave transmitting window 22, so that the plasma is generated. Also, a part of the workpiece 8 opposite to the holder 9 is arranged to protrude towards an inside of the treatment chamber 2 with respect to the microwave transmitting window 22 and is electrically connected with a negative voltage electrode 25 for applying a negative-bias voltage pulse.

Although the central conductor of the microwave transmitting window 22 is divided on the way so as to keep the vacuum, it may be penetrated inasmuch as the vacuum can be kept by the soldering with the dielectric, for example. The workpiece 8 has a rod shape, for example, and is held on the extension line of the central conductor of the microwave transmitting window 22. The workpiece may be kept so that a part of the workpiece 8 becomes the central conductor in the microwave transmitting window 22, instead of the holder 9.

The negative-voltage source 15 is configured to supply a negative bias voltage to the negative-voltage pulse generating unit 16, in response to an instruction of the controller 6. The negative-voltage pulse generating unit 16 is configured to pulse the negative bias voltage supplied from the negative-voltage source 15. The pulsing processing is processing in which the negative-voltage pulse generating unit 16 controls a magnitude, a period and a duty ratio of the negative-bias voltage pulse, in response to an instruction of the controller 6. The negative-bias voltage pulse, which is a negative bias voltage having a pulse shape, is applied to the workpiece 8 kept in the treatment chamber 2 through the negative voltage electrode 25.

That is, even when the workpiece 8 is a metal-based material or a material of which ceramic or resin is covered with a conductive material, the negative-bias voltage pulse is applied to the entirety of at least a treatment surface of the workpiece 8. Also, the negative-bias voltage pulse is applied to the entire surface of the holder 9 through the workpiece 8.

As shown in FIG. 7, the generated microwave pulses and at least a part of the negative-bias voltage pulses are controlled to be applied at the same time, so that surface wave excited plasma 45 is generated. The microwave may have a frequency of 0.3 GHz to 50 GHz, without being limited to 2.45 GHz. The negative-voltage source 15 and the negative-voltage pulse generating unit 16 are examples of the negative voltage applying unit of the present invention.

The microwave pulse controller 11, the microwave oscillator 12, the microwave power source 13, the isolator 17, the tuner 18, the waveguide 19, the coaxial waveguide 21 and the microwave transmitting window 22 are examples of the microwave supplying unit of the present invention. In the meantime, the film forming device 1 has the negative-voltage source 15 and the negative-voltage pulse generating unit 16. However, the film forming device may have a positive voltage source and a positive voltage pulse generating unit. Also, the film forming device may have a negative voltage generating unit configured to apply a continuous negative bias voltage, not the negative bias voltage having a pulse shape, instead of the negative-voltage pulse generating unit 16.

When the film forming device 1 has a negative voltage generating unit configured to apply a continuous negative bias voltage, the film forming device preferably has a positive voltage pulse generating unit, too. When a continuous negative bias voltage is continuously applied to the workpiece 8, an arcing is likely to occur. In order to reduce the arcing, a positive bias voltage having a pulse shape is preferably applied in a time period of several percents of a time period during which the negative bias voltage is applied.

As shown in FIG. 2, the controller 6 is configured to output control signals to the negative-voltage source 15 and the microwave power source 13, thereby controlling an applying power of the microwave pulse and an applying voltage of the negative voltage pulse. The controller 6 is configured to output control signals to the negative-voltage pulse generating unit 16 and the microwave pulse controller 11, thereby controlling an applying timing and a supply voltage of the negative-bias voltage pulse having a pulse shape, and a supply timing and a supply power of the microwave pulse to be generated from the microwave oscillator 12.

Also, the controller 6 is configured to output a flow rate control signal to the gas supply unit 5, thereby controlling the supply of the source gas and inert gas. The controller 6 is configured to output a control signal to the pressure adjusting valve 7 based on a pressure signal, which is input from a vacuum gauge 26 attached to the treatment chamber 2 and indicates a pressure in the treatment chamber 2, thereby controlling the pressure in the treatment chamber 2.

The controller 6 has a the CPU 31, a RAM 32, a ROM 33, a hard disk drive (hereinafter, referred to as 'HDD') 34, a timer 35 configured to measure time, a ending determination timer 36 configured to measure a processing time period of sub-processing of 'sheath thickness control processing 1' shown in FIG. 11, and the like, and is configured by a computer. The CPU 31 is configured to temporarily store a variety of information in a volatile storage device such as the RAM 32, and to execute a program for film forming processing shown in FIG. 11, for example, thereby controlling the entire film forming device 1. The ROM 33 and the HDD 34 are non-volatile storage devices and are configured to store therein the program for film forming processing shown in FIG. 11, applying timings of the microwave pulses and negative-bias voltage pulses shown in FIG. 9, an applying voltage table 55 shown in FIG. 10, and the like.

In addition, the controller 6 is electrically connected with the pressure adjusting valve 7, the vacuum gauge 26, the negative-voltage source 15, the negative-voltage pulse generating unit 16, the microwave pulse controller 11, the gas supply unit 5 and the microwave power source 13. In the meantime, the program for film forming processing shown in FIG. 11 may be read from a storage medium such as a CD-ROM, a DVD-ROM and the like by a driver (not shown) or may be downloaded from a network such as the Internet (not shown).

Description of Surface Wave Excited Plasma

In general, when generating the surface wave excited plasma, the microwaves are supplied along an interface between plasma having an electron (ion) density of a predetermined level or higher and a dielectric contacting the plasma. The supplied microwaves propagate as the surface waves at a state where the energy of electromagnetic waves is concentrated at the interface. As a result, the plasma contacting the interface is excited by the surface waves with the high energy density and is further amplified. Thereby, the high density plasma is generated and is kept. When the dielectric is changed to a conductive material, the conductive material does not function as a waveguide, and it is not possible to propagate the preferred surface waves and to excite the plasma.

In the meantime, a charged particle layer having an essentially single polarity, a so-called sheath layer is formed in the vicinity of a surface of an object contacting the plasma. When the object is the conductive workpiece 8 to which the negative bias voltage is applied, the sheath layer is a layer of which an electron density is low, i.e., a layer that is positive polarity and has a specific dielectric constant ($\in$ approximately equal to 1) in a frequency band of the microwaves. Accordingly, it is possible to increase a sheath thickness of the sheath layer by making an absolute value of the negative bias voltage to be applied higher than an absolute value of −100V, for example. That is, the sheath layer thickness expands. The sheath layer functions as a dielectric configured to propagate the surface waves to an interface between the plasma and the object contacting the plasma.

Therefore, when the microwaves are supplied from the microwave transmitting window 22 arranged to be close to one end of the holder 9 configured to hold the workpiece 8 and the negative bias voltage is applied to the workpiece 8 and the holder 9, the microwaves propagate as the surface waves along the interface between the sheath layer and the plasma. As a result, the high density excitation plasma based on the surface waves is generated along the surfaces of the workpiece 8 and holder 9. The high density excited plasma is the surface wave excited plasma 45.

The electron density of the high density plasma, which is generated by the surface wave excitation in the vicinity of the surface of the workpiece 8, is $10^{11}$ to $10^{12}$ cm$^{-3}$. When a DLC film is formed by a plasma CVD using the MVP method, the film formation speed of 3 to 30 (nanometer/sec) is obtained, which is higher by one digit to two digits, as compared to a case where the DLC film forming processing is performed by the plasma CVD of the usual negative bias voltage energy. As a result, the film formation time of the plasma CVD by the MVP method is 1/10 to 1/00 of the film formation time of the conventional plasma CVD.

Here, a relation between the sheath thickness of the sheath layer formed on the surface of the workpiece 8 and a wavelength of the surface waves propagating along the sheath layer when the electron density of the plasma is $10^{12}$ cm$^{-3}$ will be described with reference to FIG. 3. In the meantime, the workpiece 8 has a cylinder shape having a diameter of 10 mm.

Figure 3:
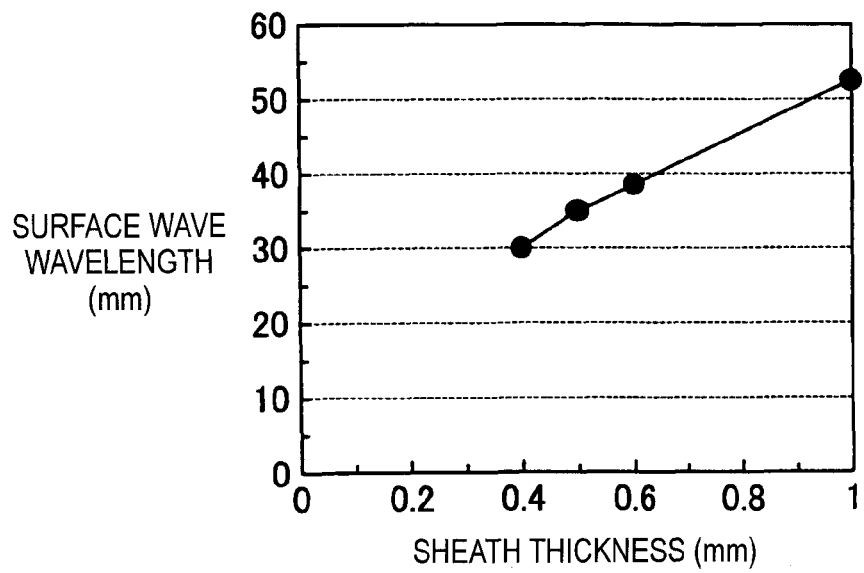
FIG. 3 shows an example of an analysis result about a sheath thickness of a sheath layer and a wavelength of surface waves at a plasma electron density of $10^{12}$ cm$^{-3}$.

As shown in FIG. 3, the wavelength of the surface wave is about 30 mm when the sheath thickness is about 0.4 mm, for example. Also, the wavelength of the surface wave is about 39 mm when the sheath thickness is about 0.6 mm, for example. Also, the wavelength of the surface wave is about 52 mm when the sheath thickness is about 1.0 mm, for example. Therefore, as the sheath thickness of the sheath layer thickens, the wavelength of the surface wave becomes longer. That is, it is possible to lengthen the wavelength of the surface wave by increasing the sheath thickness of the sheath layer and to shorten the wavelength of the surface wave by decreasing the sheath thickness of the sheath layer.

Subsequently, a relation between the electron density of the plasma and the wavelength of the surface wave when the sheath thickness of the sheath layer is 1 mm will be described with reference to FIG. 4. In the meantime, a black circle indicates data obtained when the workpiece 8 is a cylinder having a diameter of 1 mm. A black square indicates data obtained when the workpiece 8 is a cylinder having a diameter of 10 mm.

Figure 4:
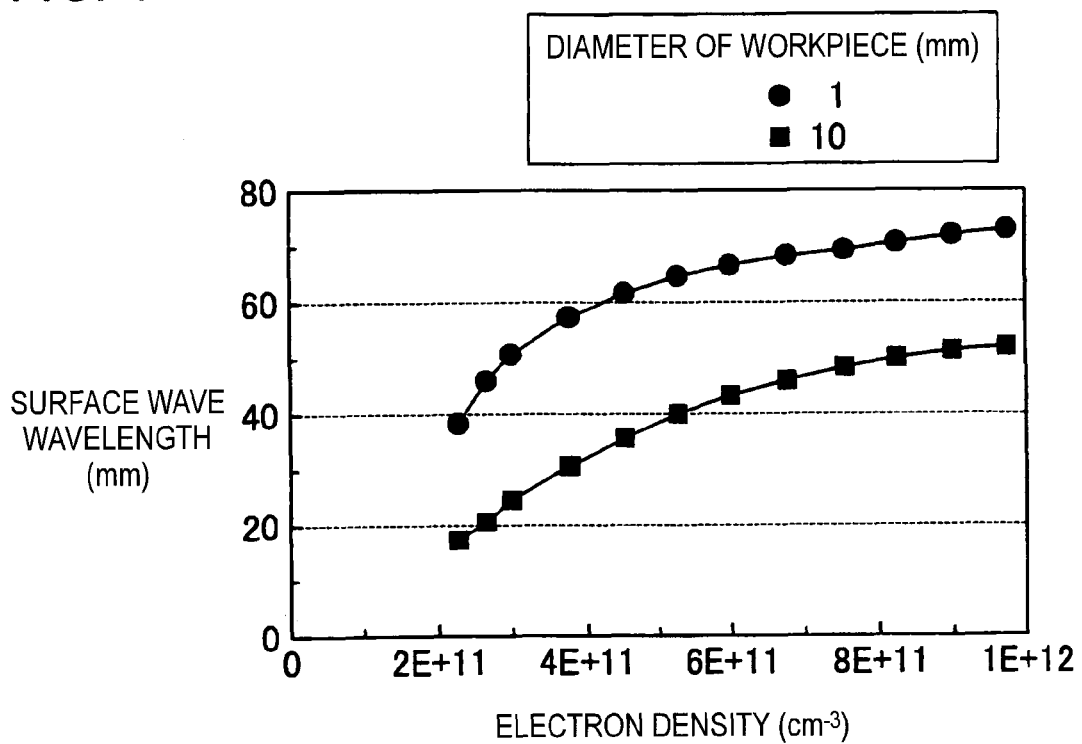
FIG. 4 shows an example of an analysis result about the plasma electron density and the wavelength of the surface waves at the sheath thickness 1 mm of the sheath layer.

As shown in FIG. 4, in a case where the electron density of the plasma is $2\times10^{11}$ cm$^{-3}$, for example, the wavelength of the surface wave is about 39 mm when the workpiece 8 has a diameter of 1 mm, and, the wavelength of the surface wave is about 19 mm when the workpiece 8 has a diameter of 10 mm. Also, in a case where the electron density of the plasma is $2\times10^{12}$ cm$^{-3}$, for example, when the workpiece 8 has a diameter of 1 mm, the wavelength of the surface wave is about 73 mm, and when the workpiece 8 has a diameter of 10 mm, the wavelength of the surface wave is about 52 mm. Therefore, as the electron density of the plasma increases, the wavelength of the surface wave lengthens. That is, it is possible to lengthen the wavelength of the surface wave by increasing the output of the microwaves to increase the electron density of the plasma and to shorten the wavelength of the surface wave by decreasing the output of the microwaves to decrease the electron density of the plasma.

Subsequently, a relation between the electron density of the plasma and the sheath thickness of the sheath layer when the negative bias voltage is a constant voltage will be described with reference to FIG. 5. In the meantime, the negative bias voltage was 0V, −200V and −400V, and the plasma potential was +30V. The electron density of the plasma and the sheath thickness of the sheath layer were analyzed when a sheath potential, which is a potential of the workpiece 8 relative to the plasma potential, was about −30V, about −230V and about −430V, respectively.

Figure 5:
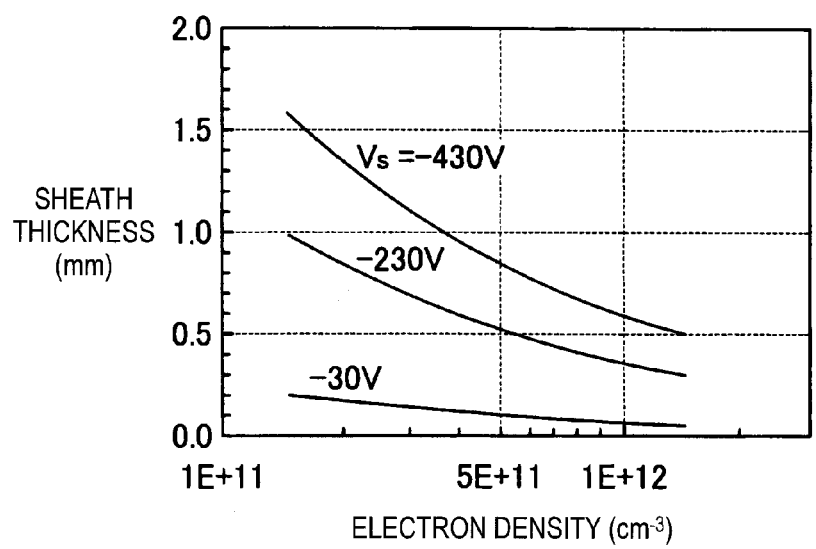
FIG. 5 shows an example of an analysis result about the plasma electron density and the sheath thickness of the sheath layer when a negative bias voltage is a constant voltage.

As shown in FIG. 5, in a case where the electron density of the plasma is $5\times10^{11}$ cm$^{-3}$, the sheath thickness of the sheath layer is about 0.1 mm when the negative bias voltage is −30V, the sheath thickness of the sheath layer is about 0.5 mm when the negative bias voltage is −230V, and the sheath thickness of the sheath layer is about 0.9 mm when the negative bias voltage is −430V. Also, in a case where the electron density of the plasma is $10^{12}$ cm$^{-3}$, the sheath thickness of the sheath layer is about 0.06 mm when the negative bias voltage is −30V, the sheath thickness of the sheath layer is about 0.4 mm when the negative bias voltage is −230V, and the sheath thickness of the sheath layer is about 0.6 mm when the negative bias voltage is −430V.

Therefore, when the electron density of the plasma is constant, as the negative bias voltage increases, the sheath thickness of the sheath layer increases. That is, when the electron density of the plasma is made to be substantially the same by making the output power of the microwave pulses substantially constant, it is possible to increase the sheath thickness of the sheath layer by increasing the negative bias voltage and to decrease the sheath thickness of the sheath layer by decreasing the negative bias voltage.

Standing Wave Distribution of Surface Waves

Subsequently, a standing wave distribution of the surface waves will be described with reference to FIGS. 3 and 6 to 8.

Figure 6A:
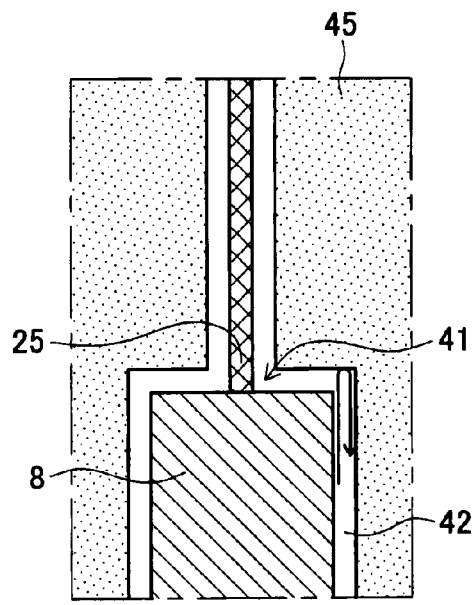
FIGS. 6A and 6B illustrate reflections of the surface waves at a discontinuous part.

As shown in FIG. 6A, when a discontinuous part 41 having a discontinuous shape is formed at a connection part between a tip portion of the workpiece 8 and the negative voltage electrode 25 in an upper and lower direction of FIG. 6A, which is a microwave supply direction, a sheath layer 42 that is formed on a surface of a periphery of the discontinuous part 41 has a discontinuous shape. Accordingly, the microwaves propagating as the surface waves in the sheath layer 42 are reflected at the part at which the sheath layer 42 formed at the periphery of the discontinuous part 41 is discontinuous, and interferes with the surface waves generated by the microwaves supplied from the upper end surface 22A of the microwave transmitting window 22, thereby generating standing waves.

Figure 7A:
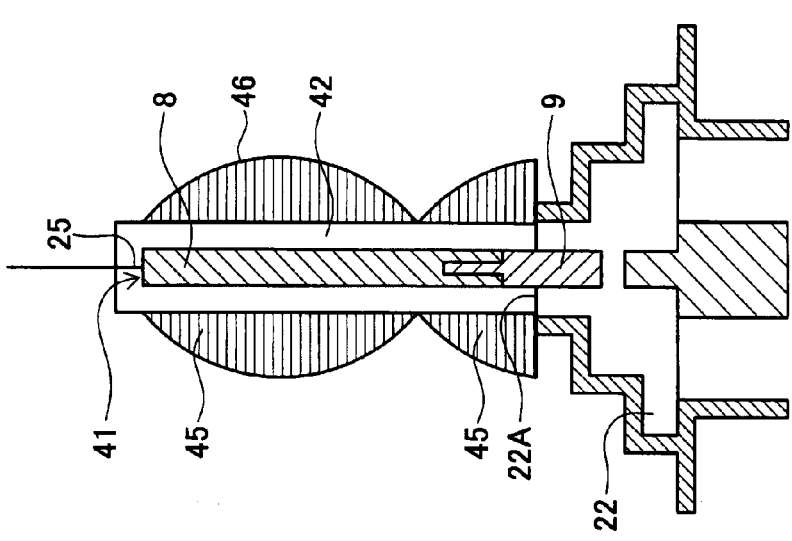
FIGS. 7A and 7B illustrate a change in a standing wave distribution of the surface waves relative to a change in the sheath thickness.

For example, as schematically shown in FIG. 7A, when the sheath thickness of the sheath layer 42 in a direction orthogonal to the propagation direction of the microwaves is small, the wavelength of the surface waves propagating along the sheath layer 42 is shortened, as shown in FIG. 3. Therefore, the surface waves reflected at the discontinuous part 41 generate standing waves 43 at a wavelength determined by the sheath thickness, the electron density of the plasma and the diameter of the workpiece 8, and the surface wave excited plasma 45 is density-distributed with a half period of the standing wave 43. Accordingly, in the plasma density distribution of the surface wave excited plasma 45, some nodes at which the plasma density is low occur in the microwave supply direction of the workpiece 8, and maximal parts in which the plasma density is maximized occur between the respective nodes.

Figure 7B:
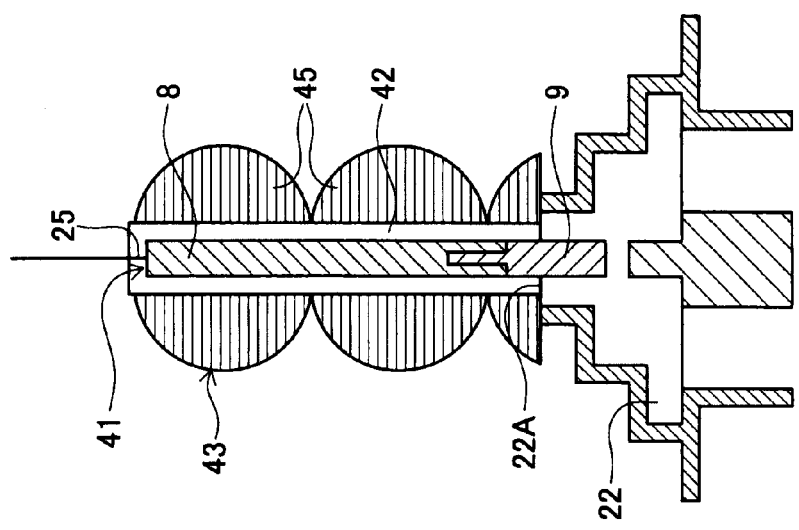

Also, for example, as schematically shown in FIG. 7B, when the sheath thickness of the sheath layer 42 is large, the wavelength of the surface waves propagating along the sheath layer 42 is lengthened, as shown in FIG. 3. Therefore, a wavelength of standing waves 44, which are generated because the surface waves having a longer wavelength than the surface waves shown in FIG. 7A are reflected at the discontinuous part 41, is also lengthened, and the surface wave excited plasma 45 has density distribution with a half period of the standing wave 46. Accordingly, in the plasma density distribution of the surface wave excited plasma 45, nodes at which the plasma density is low and which is smaller than the nodes of the plasma density shown in FIG. 7A occur, and maximal parts in which the plasma density is maximized occur between the respective nodes and in the vicinity of the upper end surface 22A of the microwave transmitting window 22.

As shown in FIGS. 7A and 7B, when positions at which the plasma density is maximized and positions at which the plasma density is minimized are fixed during the film formation, a DLC film of which film characteristics such as a film thickness, film hardness and the like are not uniform is formed on the treatment surface of the workpiece 8. Therefore, in order to uniformize the plasma density during the film formation, it is preferably to form a DLC film by varying the positions at which the plasma density is maximized and the positions at which the plasma density is minimized.

Here, as shown in FIG. 3, the wavelength of the surface waves, which are excited by the 2.45 GHz microwaves at the electron density $10^{12}$ cm$^{-3}$ of the plasma, is about 30 mm when the sheath thickness is about 0.4 mm. Also, at this time, as shown in FIG. 5, the negative bias voltage is about −200V (the sheath potential is −230V). In the meantime, in order to lengthen the wavelength of the surface wave by about ¼ wavelength and to thus increase the wavelength to about 37.5 mm, the negative bias voltage is (should be) about −358V (the sheath potential is −388V) from FIG. 5, and the sheath thickness is (should be) about 0.57 mm, as shown in FIG. 3.

Figure 8:
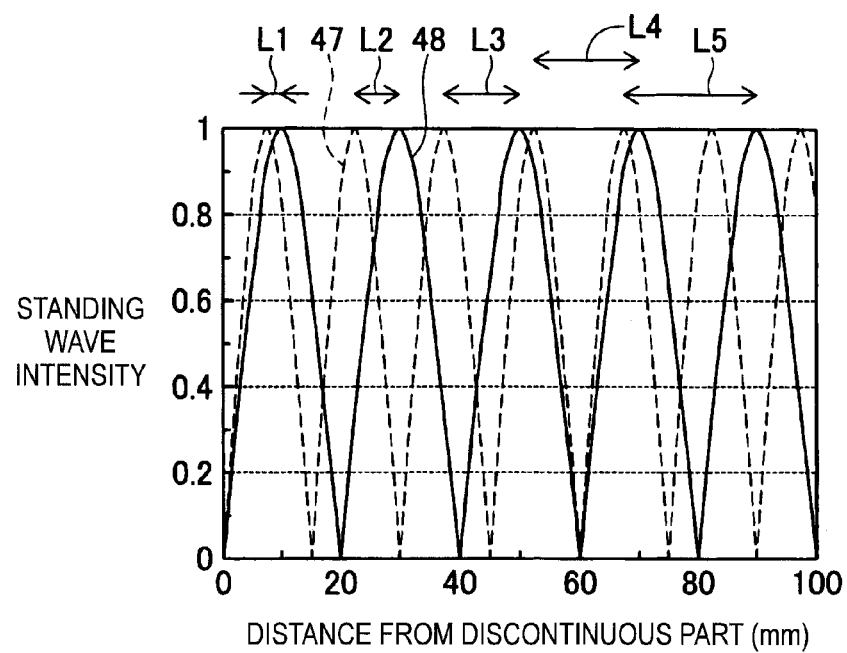
FIG. 8 shows an example of a distance from the discontinuous part and a standing wave intensity when the standing wave distribution of the surface waves changes.

Therefore, as shown in FIG. 7, the sheath thickness of the sheath layer 42 is changed between about 0.4 mm and about 0.57 mm by changing the negative bias voltage between about −200V and about −358V at the electron density $10^{12}$ cm$^{-3}$ of the plasma. Thereby, as shown in FIG. 8, the standing waves generated by the surface waves reflected at the discontinuous part 41 change between standing waves 47, which are generated when the wavelength of the surface waves is about 30 mm, and standing waves 48, which are generated when the wavelength of the surface waves is about 37.5 mm. Therefore, since the plasma density distribution of the surface wave excited plasma 45 changes between the distribution corresponding to standing waves 47 and the distribution corresponding to standing waves 48, the positions at which the plasma density is maximized and the positions at which the plasma density is minimized are varied during the film formation. Therefore, it is possible to uniformize the film characteristics of the DLC film, which is to be formed on the treatment surface of the workpiece 8, such as the film thickness, the film hardness and the like.

Also, in FIG. 8, a vertical axis indicates a relative standing wave intensity and a horizontal axis indicates a distance from the discontinuous part 41. As shown in FIG. 8, when the wavelength of the surface wave is changed between about 30 mm and about 37.5 mm, the plasma density of the surface wave excited plasma 45 is distributed with a half period of each of the standing waves 47, 48. Accordingly, the respective maximal parts at which the plasma density generated by the standing waves 47 is maximized occur at positions of about 7.5 mm, about 22.5 mm, about 37.5 mm, about 52.5 mm and about 67.5 mm, . . . from the discontinuous part 41.

Also, the respective maximal parts at which the plasma density generated by the standing waves 48 is maximized occur at positions of about 10 mm, about 30 mm, about 50 mm, about 70 mm and about 90 mm, . . . from the discontinuous part 41. Therefore, movement amounts of the respective maximal parts of the plasma density distribution of the surface wave excited plasma 45 are L1=about 2.5 mm, L2=about 7.5 mm, L3=about 12.5 mm, L4=about 17.5 mm, L5=about 22.5 mm, . . . , as each part is more distant from the discontinuous part 41. That is, each movement amount L1, L2, L3, . . . of the positions at which the plasma density is maximized or the positions at which the plasma density is minimized between the standing waves 47 and the standing waves 48 increases as their positions are is more distant from the discontinuous part 41.

Figure 6B:
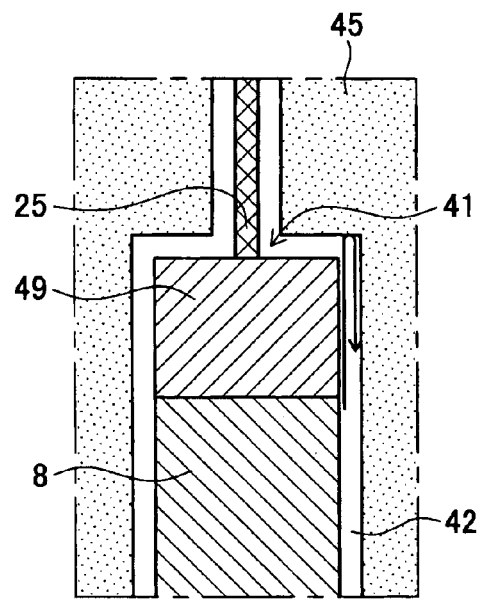

Therefore, as shown in FIG. 6B, a conductive coupling member 49 having a shape continuing to the workpiece 8 and formed of stainless steel and the like of a predetermined length (for example, about 20 mm to about 60 mm) may be provided between the tip portion of the workpiece 8 and the negative voltage electrode 25. Thereby, it is possible to further increase the change amount of the plasma density distribution of the treatment surface of the workpiece 8, i.e., the movement amount of the positions at which the plasma density is maximized or minimized, so that it is possible to further uniformize the film characteristics of the DLC film, which is to be formed on the treatment surface of the workpiece 8, such as the film thickness, the film hardness and the like.

Subsequently, an example of the applying timings of the microwave pulse and the negative-bias voltage pulse will be described with reference to FIG. 9.

Figure 9:
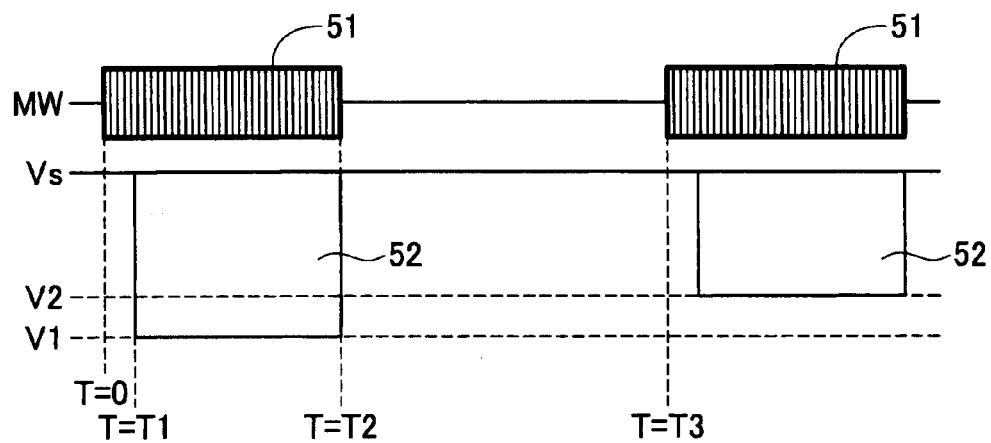
FIG. 9 is a schematic view of a waveform of a microwave pulse and a waveform of a negative-bias voltage pulse.

As shown in FIG. 9, a period of microwave pulses 51 is T3 (second). A supply time per one pulse of the microwave pulses 51 is T2 (second). In the first illustrative embodiment, T2 is set to be about a half of T3. Also, a period of negative-bias voltage pulses 52 is the same as the period of the microwave pulses 52, i.e., T3 (second). For example, the periods of the microwave pulses 51 and the negative-bias voltage pulses 52 are all T3=2 (milliseconds).

An applying time of the negative-bias voltage pulse 52 is (T2−T1) (second), and is set to a time of 90% or greater of the supply time T2 (seconds) of the microwave pulse 51. An applying timing of the negative-bias voltage pulse 52 is set to be delayed by T1 (second), as compared to a supply start timing of the microwave pulse 51. That is, the negative-bias voltage pulse 52 is applied after the microwave pulse 51 rises and the power is stable. For example, the delay time T1=8 (microseconds). The information indicating the respective times T1, T2, T3 (seconds) is stored in the ROM 33 or HDD 34.

Subsequently, an example of the applying voltage table 55 stored in the ROM 33 or HDD 34 will be described with reference to FIG. 10.

As shown in FIG. 10, the applying voltage table 55 has a 'sequence', a 'microwave output (kW)' and a 'negative bias voltage (V)'. In the 'sequence', a sequence '1' to 'M'$^{th}$ of supplying the microwave pulse is stored.

Also, in the 'microwave output (kW)', an output power of 2.45 GHz microwave is stored in association with the 'sequence' of supplying the microwave pulse 51. Meanwhile, in the first illustrative embodiment, the output is substantially 1 (kW) and is a constant value. Also, in the 'negative bias voltage (V)', a negative applying voltage value of the negative-bias voltage pulse 52 to be applied to the negative voltage electrode 25 is stored in association with the 'sequence' of supplying the microwave pulse 51. That is, the negative applying voltage value of the negative-bias voltage pulse 52 set to change the sheath thickness of the sheath layer 42 within a predetermined range is stored in association with the 'sequence' of supplying the microwave pulse 51.

For example, the negative applying voltage value, which is changed randomly or with a constant cycle between about −200V and about −358V so as to change the sheath thickness of the sheath layer 42 between about 0.4 mm and about 0.57 mm at the electron density of $10^{12}$ cm$^{-3}$ of the plasma, is stored in association with the 'sequence' of supplying the microwave pulse 51.

Film Forming Processing

Subsequently, film forming processing of forming a DLC film on the treatment surface of the workpiece 8, which is processing to be executed by the CPU 31 of the film forming device 1 configured as described above, will be described with reference to FIGS. 11 to 13. The film forming processing is executed when the CPU 31 detects that an operator's instruction to start the film forming processing is input to the controller 6 of the film forming device 1 through an operation button provided on an operation unit (not shown) at a state where the workpiece 8 held at the holder 9 is set in the treatment chamber 2.

Figure 11:
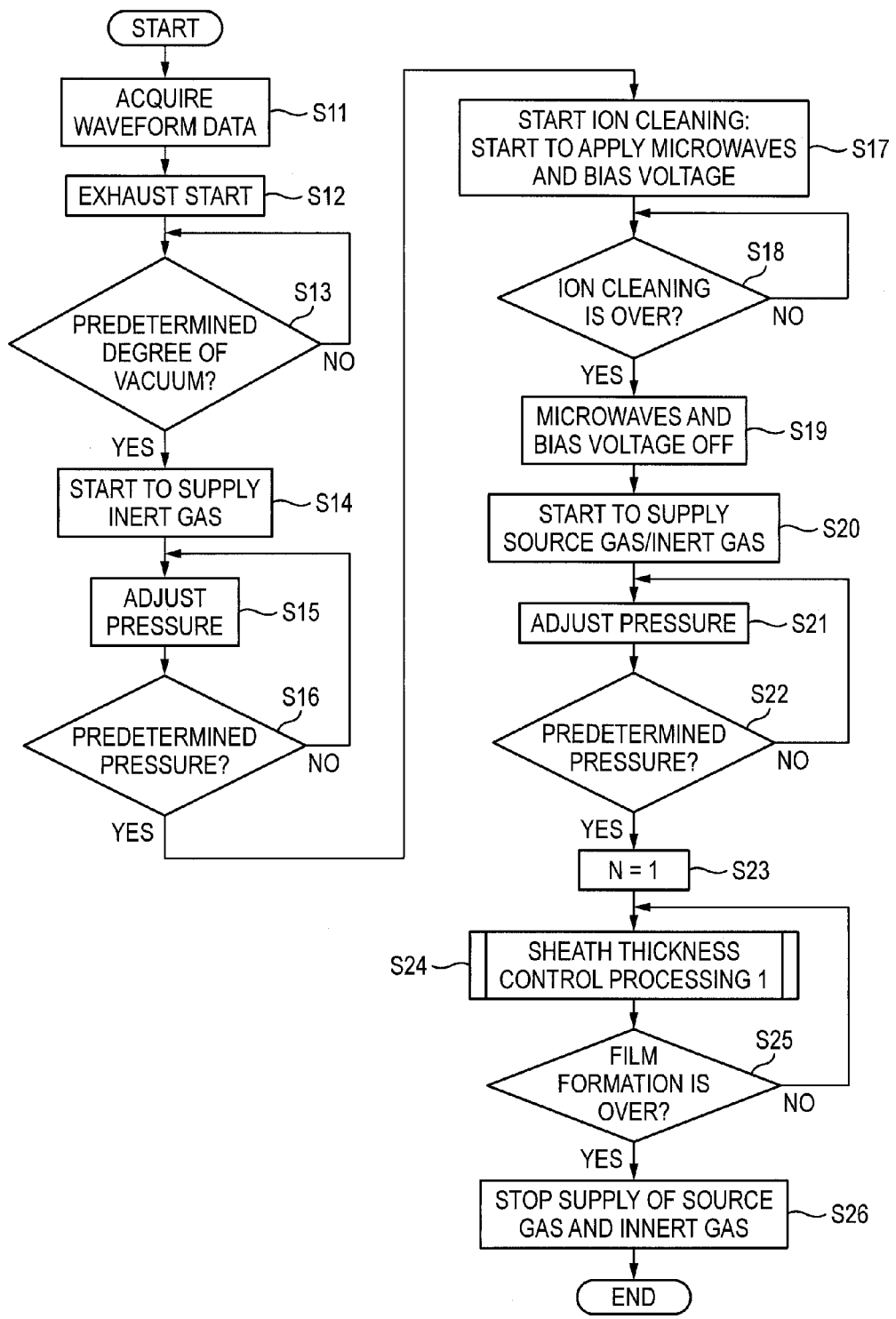
FIG. 11 is a main flowchart showing 'film forming processing' that is to be executed by a CPU of the controller according to the first illustrative embodiment.

As shown in FIG. 11, in step (hereinafter, abbreviated to 'S') 11, the CPU 31 reads out the information, which indicates the period T3 (seconds) of the microwave pulse 51 shown in FIG. 9, and the information, which indicates the supply time T2 (seconds) for one pulse, from the ROM 33 or HDD 34, and stores the same in the RAM 32. For example, the period T3 of the microwave pulse 51 is 2 (milliseconds), and the supply time T2 for one pulse is 1 (millisecond). Also, the CPU reads out the applying voltage table 55 and ion cleaning parameters (which will be described later) from the ROM 33 or HDD 34 and stores the same in the RAM 32.

Also, the CPU 31 reads out the information, which indicates the period T3 (seconds) of the negative-bias voltage pulse 52 shown in FIG. 9, the information, which indicates the applying time (T2−T1) (seconds) for one pulse, and the information, which indicates the delay time T1 (seconds) from the supply start timing of the microwave pulse 51, from the ROM 33 or HDD 34, and stores the same in the RAM 32. For example, the period T3 of the negative-bias voltage pulse 52 is 2 (milliseconds), the applying time (T2−T1) for one pulse is 992 (microseconds), and the delay time T1 is 8 (microseconds). In the meantime, the delay time T1 may be set to about 5 (microseconds) to 20 (microseconds). Also, each time T1, T2, T3 (seconds) may be input to the controller 6 of the film forming device 1 through the operation unit (not shown) by the operator.

Then, in S12, the CPU 31 reads out predetermined parameters from the ROM 33 or HDD 34, stores the same in the RAM 32 and activates the vacuum pump 3. The predetermined parameters are ion cleaning parameters, gas flow rate values and the like. The parameters may be manually set by the operator or may be automatically set based on parameters stored in advance in the ROM 33 or HDD 34. The ion cleaning parameters are parameters of ion cleaning processing, which will be described later.

Then, in S13, the CPU 31 executes determination processing of determining whether the inside of the treatment chamber 2 reaches a predetermined degree of vacuum (for example, less than 1.0 Pa), based on the pressure signal input from the vacuum gauge 26. The predetermined degree of vacuum is stored in advance in the ROM 33 or HDD 34. When it is determined that the inside of the treatment chamber 2 does not reach a predetermined degree of vacuum (S13: NO), the CPU 31 again executes the processing of S13.

On the other hand, when it is determined that the inside of the treatment chamber 2 reaches a predetermined degree of vacuum (for example, less than 1.0 Pa) (S13: YES), the CPU 31 proceeds to processing of S14. In S14, the CPU 31 reads out a gas flow rate value (for example, gas flow rate 200 sccm) of the inert gas Ar, which is the ion cleaning parameter, from the RAM 32, and outputs a supply signal for instructing the gas supply unit 5 to supply the inert gas Ar into the treatment chamber 2 with the gas flow rate value, that is read out. That is, the supply of the inert gas Ar is enabled to start.

Then, in S15, the CPU 31 sets to exhaust the source gas and inert gas in the treatment chamber 2 with constant flow rates and adjusts the inside of the treatment chamber 2 to a predetermined pressure, through the pressure adjusting valve 7. Continuously, in S16, the CPU 31 executes determination processing of determining whether the inside of the treatment chamber 2 reaches a predetermined pressure, based on the pressure signal input from the vacuum gauge 26. When it is determined that the inside of the treatment chamber 2 does not reach a predetermined pressure (S16: NO), the CPU 31 again executes the processing of S15 and thereafter.

On the other hand, when it is determined that the inside of the treatment chamber 2 reaches a predetermined pressure (S16: YES), the CPU 31 proceeds to processing of S17. In S17, the CPU 31 starts an ion cleaning based on the ion cleaning parameters. The ion cleaning parameters include an output power (for example, 800 W) of the microwave, and an applying voltage (for example, −200V) of the negative-bias voltage pulse.

Specifically, the CPU 31 transmits the applying voltage value of the negative-bias voltage pulse to the negative-voltage source 15. The CPU 31 transmits the output power value of the microwave to the microwave power source 13. The CPU 31 transmits on and off signals of the negative-bias voltage pulses 52 to the negative-voltage pulse generating unit 16, based on the period T3 (seconds) of the negative-bias voltage pulse 52, the applying time (T2−T1) (seconds) for one pulse and the delay time T1 (seconds) from the supply start timing of the microwave pulse 51, which are acquired in S11. The CPU 31 transmits on and off signals of the microwave pulses 51 to the microwave pulse controller 11, based on the period T3 (seconds) of the microwave pulse 51 and the supply time T2 (seconds) for one pulse, which are acquired in S11.

As a result, the negative-voltage source 15 supplies the negative applying voltage to the negative-voltage pulse generating unit 16, in accordance with the received applying voltage value. The negative-voltage pulse generating unit 16 supplies the negative-bias voltage pulses 52 to the workpiece 8 through the negative voltage electrode 25 for the applying time (T2−T1) (seconds) after the delay time T1 (seconds) by the supplied negative applying voltage and the on and off signals of the negative-bias voltage pulses 52 received every the period T3 (second).

Also, the microwave power source 13 feeds the power to the microwave oscillator 12, in accordance with the received microwave output power value. The microwave pulse controller 11 transmits the pulse signal of the supply time T2 (seconds) to the microwave oscillator 12 every the period T3 (second), in accordance with the received on and off signals of the microwave pulses 51. The microwave oscillator 12 supplies the microwave pulses 51 of the supply time T2 (seconds) corresponding to the received pulse signal, every the period T3 (second), towards the holder 9 and the workpiece 8 with the 2.45 GHz microwave power corresponding to the fed power through the isolator 17, the tuner 18, the waveguide 19, the coaxial waveguide 21 and the microwave transmitting window 22.

Thereby, as shown in FIG. 7, the sheath layer 42, which is along with the surface of the workpiece 8, is expanded in the direction orthogonal to the propagation direction of the microwaves, i.e., in the horizontal direction of FIG. 7 by the negative-bias voltage pulses 52, and the plasma of the inert gas Ar is generated by the microwave pulses 51 propagating along the sheath layer 42. By the generated plasma of the inert gas Ar, the surface of the workpiece 8 is ion-cleaned, so that a DLC film (which will be described later) can be easily formed. When the ion cleaning starts, the CPU 31 proceeds to processing of S18.

In S18, the CPU 31 determines whether or not to end the ion cleaning. The determination is made by determining whether an arcing occurring frequency is less than a predetermined frequency. The predetermined frequency is stored in advance in the ROM 33 or HDD 34. When it is determined that an arcing occurring frequency is equal to or greater than a predetermined frequency (S18: NO), the CPU 31 again executes the processing of S18.

On the other hand, when it is determined that an arcing occurring frequency is less than a predetermined frequency (S18: YES), the CPU 31 proceeds to processing of S19. In the meantime, the CPU 31 may make the ending determination by determining whether a time from the ion cleaning start, which is measured by the timer 35, exceeds an ion cleaning time set as the ion cleaning parameter.

In S19, the CPU 31 transmits a stop signal to the microwave pulse controller 11, which instructs to stop the pulse signal being transmitted to the microwave oscillator 12. Thereby, since the microwave oscillator 12 does not receive the pulse signal, the microwave oscillator stops the output of the microwave pulse 51. Also, the CPU 31 transmits a stop signal to the negative-voltage pulse generating unit 16, which instructs to stop the application of the negative-bias voltage pulse 52. Thereby, the negative-voltage pulse generating unit 16 stops the application of the negative-bias voltage pulse 52 to the workpiece 8.

Continuously, in S20, the CPU 31 reads out the gas flow rate values of the source gas and inert gas from the ROM 33 or HDD 34, transmits the same to the gas supply unit 5, as a flow rate control instruction, and then proceeds to processing of S21. Thereby, the gas supply unit 5 supplies the source gas and inert gas into the treatment chamber 2, in accordance with the flow rate control instruction. In the meantime, the respective flow rate values of the source gas and inert gas are stored in advance in the ROM 33 or HDD 34. For example, the flow rate of the inert gas Ar is 40 sccm. The flow rate of $CH_4$ is 200 sccm. The flow rate of $C_2H_2$ is 0 sccm. The flow rate of TMS is 20 sccm.

In S21, the CPU 31 sets to exhaust the source gas and inert gas in the treatment chamber 2 with constant flow rates and adjusts the inside of the treatment chamber 2 to a predetermined pressure, through the pressure adjusting valve 7. Continuously, in S22, the CPU 31 executes determination processing of determining whether the inside of the treatment chamber 2 reaches the predetermined pressure, i.e., whether the flow rates of the source gas and inert gas are stabilized, based on the pressure signal input from the vacuum gauge 26. When it is determined that the inside of the treatment chamber 2 does not reach the predetermined pressure (S22: NO), the CPU 31 again executes the processing of S21 and thereafter.

On the other hand, when it is determined that the inside of the treatment chamber 2 reaches the predetermined pressure (S22: YES), the CPU 31 reads out a count value N of a sequential counter from the RAM 32, in S23, substitutes '1' for the count value N and again stores the count value in the RAM 32. That is, the CPU 31 initializes the count value of the sequential counter. At the same time, the CPU 31 resets the measured time of the ending determination timer 36 to '0' and enables to measure the processing time.

Continuously, in S24, the CPU 31 executes sub-processing shown in FIG. 12, which is 'sheath thickness control processing 1' of changing the sheath thickness every one pulse of the microwave pulses 51 (which will be described later), and proceeds to processing of S25. In S25, the CPU 31 executes determination processing of determining whether the film forming processing of forming the DLC film on the surface of the workpiece 8 is over. Specifically, the CPU 31 reads out information, which indicates the processing time of the sub-processing of the 'sheath thickness control processing 1' being executed in S24, from the ROM 33 or HDD 34, and executes determination processing of determining whether the ending determination timer 36 reaches the processing time. The processing time of the sub-processing of the 'sheath thickness control processing 1' to be executed in S24 may be manually set by the operator or may be automatically set based on a parameter stored in advance in the ROM 33 or HDD 34.

When it is determined that the film forming processing of forming the DLC film on the surface of the workpiece 8 is not over, i.e., when it is determined that the measured time of the ending determination timer 36 does not reach the processing time of the sub-processing being executed in S24 (S25: NO), the CPU 31 again executes the processing of S24 and thereafter. On the other hand, when it is determined that the film forming processing of forming the DLC film on the surface of the workpiece 8 is over, i.e., when it is determined that the measured time of the ending determination timer 36 reaches the processing time of the sub-processing being executed in S24 (S25: YES), the CPU 31 proceeds to processing of S26.

In S26, the CPU 31 transmits a supply stop signal to the gas supply unit 5, which instructs to stop the supply of the source gas and inert gas. Also, the CPU 31 transmits an exhaust signal to the pressure adjusting valve 7, which instructs to perform the exhaust at a full opening state. Thereby, the gas supply unit 5 stops the supply of the source gas and inert gas into the treatment chamber 2, in accordance with the supply stop signal. The pressure adjusting valve 7 is fully opened to rapidly exhaust the source gas and inert gas remaining in the treatment chamber 2 by the vacuum pump 3. Thereafter, the CPU 31 ends the processing.

Sheath Thickness Control Processing 1

Subsequently, the sub-processing, which is the 'sheath thickness control processing 1' to be executed by the CPU 31 in S24, will be described with reference to FIGS. 12 and 13.

Figure 12:
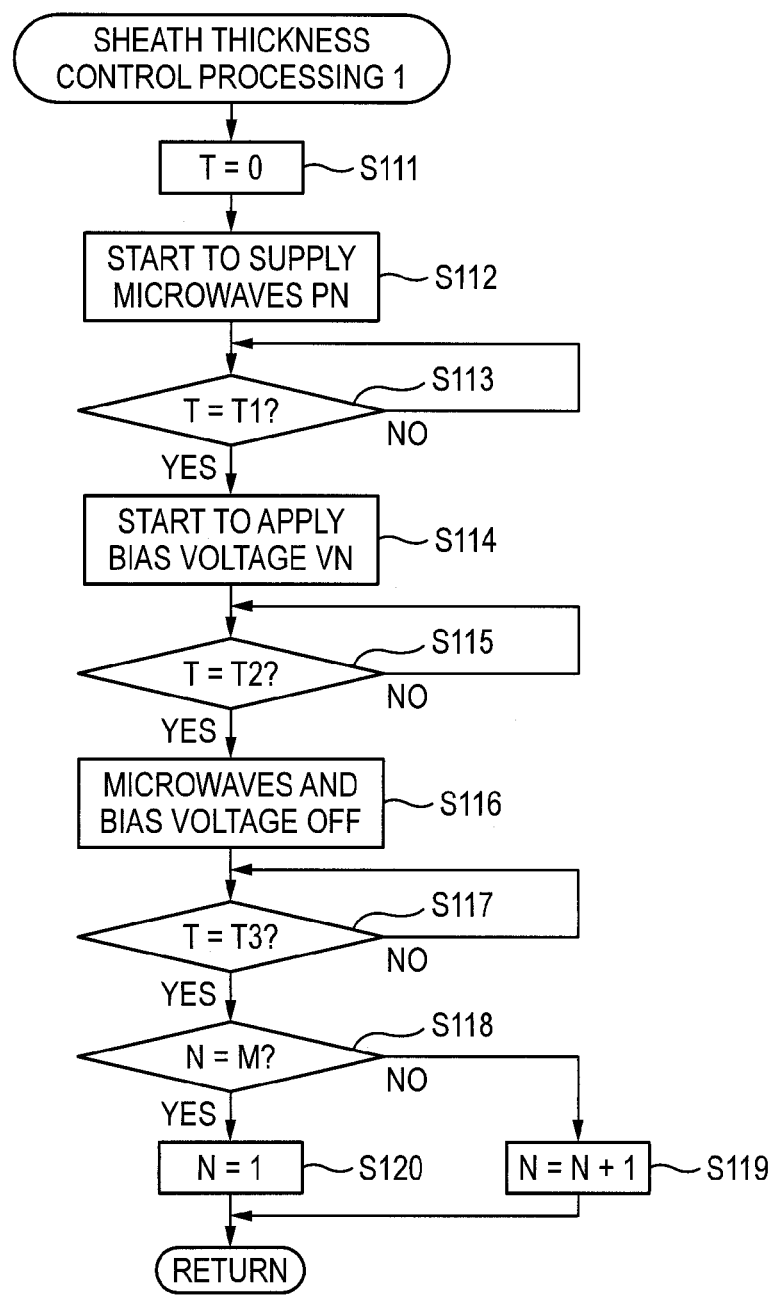
FIG. 12 is a sub-flowchart showing sub-processing of 'sheath thickness control processing 1' of FIG. 11.

As shown in FIG. 12, in S111, the CPU 31 resets the measured time of the timer 35 to '0', and starts to measure the film formation time. Then, in S112, the CPU 31 sets the count value N of the sequential counter to the 'sequence' of the applying voltage table 55 shown in FIG. 10, and reads out the 'microwave output (kW)' associated with the 'sequence' from the applying voltage table 55.

The, the CPU 31 transmits the microwave output power value to the microwave power source 13. The CPU 31 transmits the microwave pulse on signal to the microwave pulse controller 11. As a result, the microwave power source 13 feeds the power to the microwave oscillator 12, i.e., supplies the applying voltage or anode current to be applied to a magnetron of the microwave oscillator 12, in accordance with the received microwave output power value. The microwave pulse controller 11 starts to transmit a pulse signal of the supply time T2 (seconds) towards the microwave oscillator 12 in conformity to processing of S116 (which will be described later), in accordance with the information indicating the received supply time T2 (second).

The microwave oscillator 12 starts to supply the 2.45 GHz microwave pulses 51 of the supply time T2 (seconds) towards the holder 9 and the workpiece 8 with the fed power through the isolator 17, the tuner 18, the waveguide 19, the coaxial waveguide 21 and the microwave transmitting window 22.

Continuously, in S113, the CPU 31 executes determination processing of determining whether the measured time of the timer 35 reaches the delay time T1 (second), i.e., the applying timing of the negative-bias voltage pulse 52. When it is determined that the measured time of the timer 35 does not reach the delay time T1 (seconds) (S113: NO), the CPU 31 again executes the processing of S113.

On the other hand, when it is determined that the measured time of the timer 35 reaches the delay time T1 (seconds) (S113: YES), the CPU 31 proceeds to processing of S114. In S114, the CPU 31 sets the count value N of the sequential counter to the 'sequence' of the applying voltage table 55 of FIG. 10, and reads out the applying voltage of the negative-bias voltage pulse of the 'negative bias voltage (V)' associated with the 'sequence' from the applying voltage table 55.

Then, the CPU 31 transmits the applying voltage value of the negative-bias voltage pulse to the negative-voltage source 15. The CPU 31 transmits the negative-bias voltage pulse on signal to the negative-voltage pulse generating unit 16. As a result, the negative-voltage source 15 supplies the negative voltage to the negative-voltage pulse generating unit 16, in accordance with the received applying voltage value. The negative-voltage pulse generating unit 16 starts to apply the negative-bias voltage pulse 52 of the applying time (T2−T1) (seconds) to the workpiece 8 with the supplied negative applying voltage through the negative voltage electrode 25, in conformity to processing of S116, which will be described later.

Continuously, in S115, the CPU 31 executes determination processing of determining whether the measured time of the timer 35 reaches the supply time T2 (seconds) of the microwave pulse 51. When it is determined that the measured time of the timer 35 does not reach the supply time T2 (seconds) of the microwave pulse 51 (S115: NO), the CPU 31 again executes the processing of S115. On the other hand, when it is determined that the measured time of the timer 35 reaches the supply time T2 (seconds) of the microwave pulse 51 (S115: YES), the CPU 31 proceeds to the processing of S116.

In S116, the CPU 31 transmits the microwave pulse off signal to the microwave pulse controller 11, which instructs to stop the pulse signal being transmitted to the microwave oscillator 12. Thereby, since the microwave oscillator 12 does not receive the pulse signal, it stops the output of the microwave pulse 51. Also, the CPU 31 transmits the negative-bias voltage pulse off signal to the negative-voltage pulse generating unit 16, which instructs to stop the application of the negative-bias voltage pulse 52. Thereby, the negative-voltage pulse generating unit 16 stops the application of the negative-bias voltage pulse 52 to the workpiece 8.

Continuously, in S117, the CPU 31 executes determination processing of determining whether the measured time of the timer 35 reaches the period T3 (seconds) of the microwave pulse 51. When it is determined that the measured time of the timer 35 does not reach the period T3 (seconds) of the microwave pulse 51 (S117: NO), the CPU 31 again executes the processing of S117. On the other hand, when it is determined that the measured time of the timer 35 reaches the period T3 (seconds) of the microwave pulse 51 (S117: YES), the CPU 31 proceeds to the processing of S118.

In S118, the CPU 31 executes determination processing of determining whether the count value N of the sequential counter reaches the final number of times M of the 'sequence' of the applying voltage table 55. When it is determined that the count value N of the sequential counter does not reach the final number of times M (S118: NO), the CPU 31 proceeds to the processing of S119. In S119, the CPU 31 adds one to the count value N of the sequential counter, ends the sub-processing, returns to the main flowchart and proceeds to the processing of S25.

On the other hand, when it is determined that the count value N of the sequential counter reaches the final number of times M (S118: YES), the CPU 31 proceeds to processing of S120. In S120, the CPU 31 substitutes one for the count value N of the sequential counter to initialize the same, ends the sub-processing, returns to the main flowchart, and proceeds to the processing of S25.

Here, an example of the 'sheath thickness control processing 1' where the film is formed while changing the sheath thickness of the sheath layer 42 between about 0.4 mm and about 0.57 mm at the plasma electron density $10^{12}$ cm$^{-3}$ in the treatment chamber 2 will be described with reference to FIG. 13.

Figure 13:
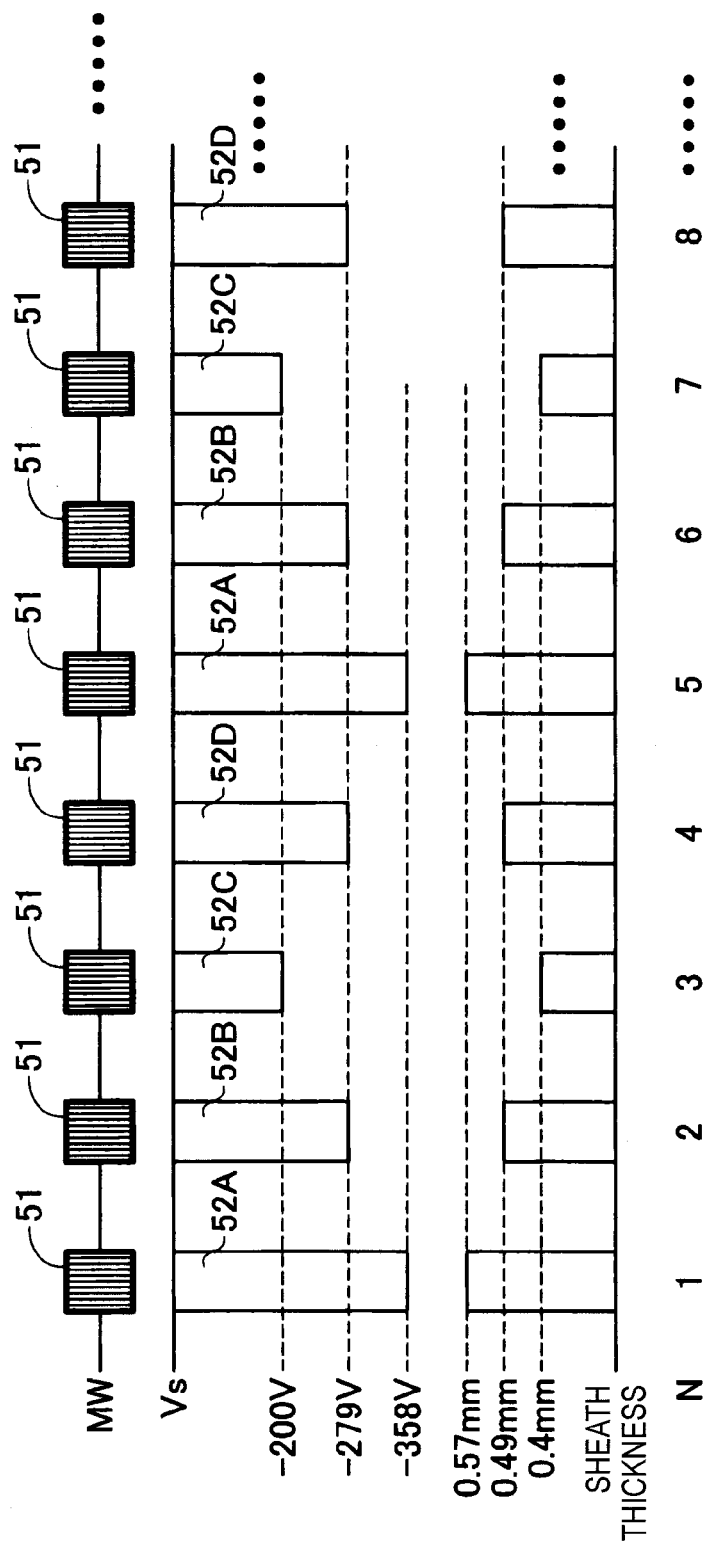
FIG. 13 illustrates an example where different negative bias voltages are applied every one pulse of the microwave pulses.

As shown in FIG. 13, whenever supplying one pulse of each microwave pulse 51 of which the microwave output power is about 1 kW, a negative-bias voltage pulse 52A of which the negative applying voltage is −358V (the sheath potential is −388V), a negative-bias voltage pulse 52B of which the negative applying voltage is −279V (the sheath potential is −309V), a negative-bias voltage pulse 52C of which the negative applying voltage is −200V (the sheath potential is −230V), and a negative-bias voltage pulse 52D of which the negative applying voltage is −279V are repeatedly applied to the workpiece 8 in corresponding order.

As a result, it is possible to repeatedly change the sheath thickness of the sheath layer 42 formed on the surface of the workpiece 8 in order of about 0.57 mm, about 0.49 mm, about 0.4 mm and about 0.49 mm whenever supplying one pulse of each microwave pulse 51 of which the microwave output power is about 1 kW. Thereby, the wavelength of the surface waves propagating along the sheath layer 42 is repeatedly changed in order of about 37.5 mm, about 33.8 mm, about 30 mm, and about 33.8 mm.

Therefore, the surface wave changes at each wavelength of the surface waves, so that the plasma density distribution of the surface wave excited plasma 45 changes for each standing wave. That is, since the positions at which the plasma density increases and decreases in the longitudinal direction of the workpiece 8, i.e., in the microwave supply direction sequentially change and the plasma density is averaged, the uniformity of the plasma density distribution in the longitudinal direction of the workpiece 8 is improved. Accordingly, it is possible to uniformize the film characteristics of the DLC film formed on the treatment surface of the workpiece 8, such as the film thickness, the film hardness and the like.

As described above, according to the film forming device 1 of the first illustrative embodiment, the CPU 31 is configured to apply the negative-bias voltage pulses 52 to the workpiece 8 through the negative voltage electrode 25 while supplying of the microwave pulses 51, thereby generating the sheath layer 42. Also, when the applying voltage of the negative-bias voltage pulse 52 is changed for each pulse of the microwave pulses 51, the sheath thickness of the sheath layer 42 is changed, so that it is possible to change the distribution of the standing waves generated by the microwaves propagating as the surface waves with the high energy density in the sheath layer 42.

Thereby, it is possible to change the standing wave distribution of the plasma density of the high density plasma of the source gas plasma-excited by the surface waves, and the plasma density is averaged and uniformized in the longitudinal direction of the workpiece 8, i.e., in the propagation direction of the surface waves propagating along the sheath layer 42. Therefore, it is possible to uniformize the film characteristics of the DLC film formed on the surface of the workpiece 8, such as the film thickness, the film hardness and the like. In the meantime, when the sheath thickness of the sheath layer 42 is changed to change the wavelength of the surface waves propagating along the sheath layer 42 by ¼ wavelength or greater, it is possible to further uniformize the film characteristics of the DLC film formed on the surface of the workpiece 8, such as the film thickness, the film hardness and the like.

Also, the negative-bias voltage pulses 52 having the plurality of types of pulse shapes of which the negative applying voltages are different is sequentially applied for each pulse of the microwave pulses 51, so that the expansion and reduction of the sheath thickness are repeated. Thereby, it is possible to uniformize the averaged plasma density distribution by continuously changing the distribution of the standing waves generated by the microwaves propagating as the surface waves with the high energy density in the sheath layer 42 without fixing the same, so that it is possible to further uniformize the film characteristics of the DLC film formed on the surface of the workpiece 8, such as the film thickness, the film hardness and the like.

Also, since the sheath thickness is changed by changing the negative applying voltages of the negative-bias voltage pulses 52 to be applied to the workpiece 8 while supplying of the microwave pulses 51, it is possible to change the sheath thickness of the sheath layer 42 at high speed. Thereby, it is possible to rapidly change the distribution of the standing waves generated by the microwaves propagating as the surface waves with the high energy density in the sheath layer 42, thereby improving the followability to the high speed film formation by the MVP method. That is, according to the MVP method, it takes the processing time of several tens of seconds to form a DLC film having a thickness of about 1 to 2 μm. During the processing time, it is possible to change the thickness of the sheath layer 42 at high speed.

Second Illustrative Embodiment

Subsequently, a film forming device 61 of a second illustrative embodiment will be described with reference to FIGS. 14 to 16. Meanwhile, in below descriptions, the same reference numerals as the configurations of the film forming device 1 of the first illustrative embodiment shown in FIGS. 1 to 13 indicate the same or equivalent configurations as or to those of the film forming device 1 of the first illustrative embodiment. Meanwhile, in FIG. 16, an outline of a surface wave excited plasma 66 is actually an undulating shape due to an influence of the standing waves. Also, an actual magnitude of the surface wave excited plasma 66 is not limited to that of the surface wave excited plasma 66 shown in FIG. 16.

A schematic configuration of the film forming device 61 according to the second illustrative embodiment is substantially the same as the film forming device 1 of the first illustrative embodiment.

Figure 14:
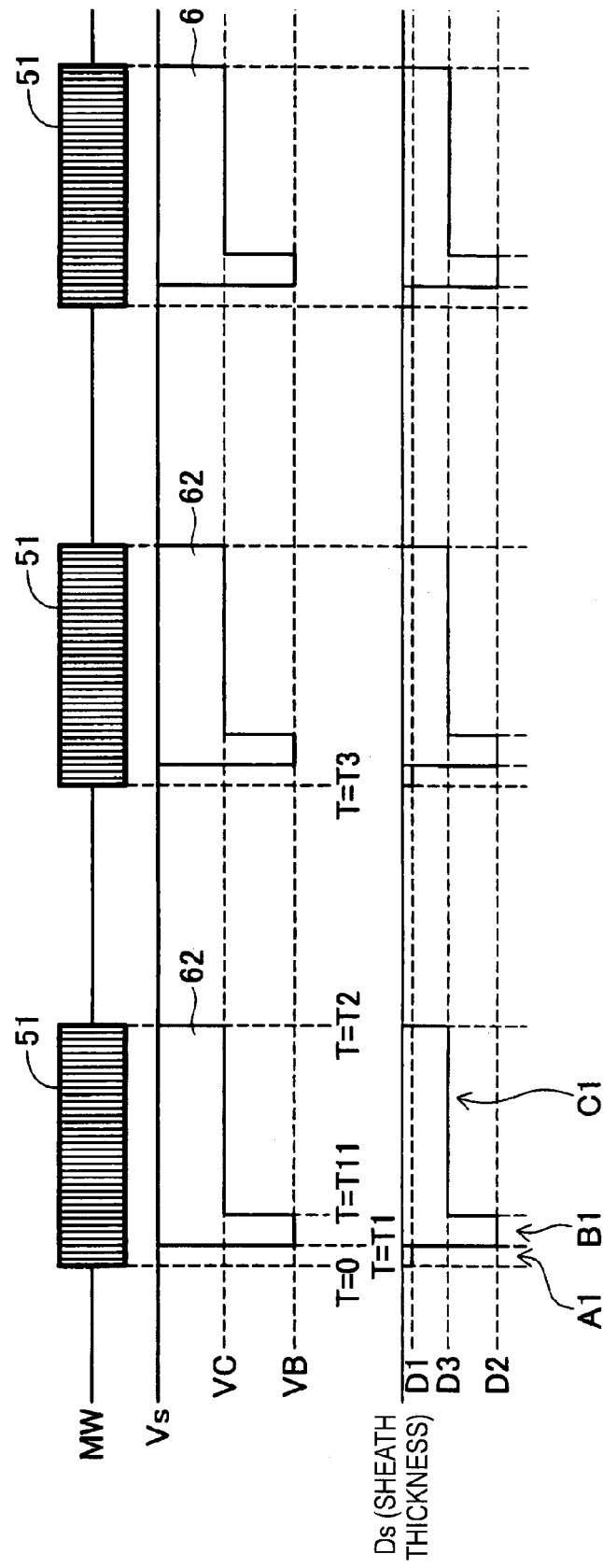
FIG. 14 illustrates an example where a voltage value of the negative bias voltage is changed within one pulse of the microwave pulses by the CPU of the controller according to a second illustrative embodiment.

However, instead of the applying timings of the microwave pulse 51 and the negative-bias voltage pulse 52 shown in FIG. 9, the applying timings of the microwave pulse 51 and a negative-bias voltage pulse 62 shown in FIG. 14 are stored in the ROM 33 or HDD 34. Also, instead of the applying voltage table 55 shown in FIG. 10, an initial applying voltage VA ('0V'), a negative applying voltage VB for initial sheath layer expansion, and a negative applying voltage VC for usual sheath layer expansion of the negative-bias voltage pulse 62 are stored in the ROM 33 or HDD 34. That is, an applying voltage waveform of each pulse of the negative-bias voltage pulses 62 is substantially the same.

The negative applying voltage VB for initial sheath layer expansion is a voltage for extending and expanding a negative sheath layer over the entire workpiece 8 from a peripheral edge portion of the microwave transmitting window 22. The negative applying voltage VC for usual sheath layer expansion is a voltage for expanding and keeping the negative sheath layer extended over the entire workpiece 8. Therefore, in absolute value, the negative applying voltage VB for initial sheath layer expansion is larger than the negative applying voltage VC for usual sheath layer expansion because it extends the sheath layer formed at the peripheral edge portion of the microwave transmitting window 22 over the entire workpiece 8.

Here, the negative applying voltage VB for initial sheath layer expansion is set as an applying voltage larger than the negative applying voltage VC for usual sheath layer expansion, in absolute value. For example, the negative applying voltage VB for initial sheath layer expansion is −400V (the sheath potential is −430V), and the negative applying voltage VC for usual sheath layer expansion is −200V (the sheath potential is −230V). Also, in S24 of the 'film forming processing', the CPU 31 executes sub-processing of 'sheath thickness control processing 2' shown in FIG. 15, instead of the sub-processing of the 'sheath thickness control processing 1' shown in FIG. 12.

First, the applying timings of the microwave pulse 51 and the negative-bias voltage pulse 62 are described with reference to FIG. 14.

As shown in FIG. 14, the microwave pulse 51 has the same pulse waveform as the microwave pulse 51 of the film forming device 1 according to the first illustrative embodiment. Also, a period of the negative-bias voltage pulse 62 is the same as the period of the microwave pulse 51.

The applying timing of the negative-bias voltage pulse 62 is the same as the applying timing of the negative-bias voltage pulse 52 of the film forming device 1 according to the first illustrative embodiment. Continuously, regarding the negative-bias voltage pulse 62, the negative applying voltage VB for initial sheath layer expansion is applied during the applying time (T11−T1). For example, the applying time (T11−T1) of the negative applying voltage VB for initial sheath layer expansion is 10 (microseconds).

Regarding the negative-bias voltage pulse 62, the negative applying voltage VC for usual sheath layer expansion is applied during the applying time (T2−T11). Also, the applying time (T2−T11) of the negative applying voltage VC for usual sheath layer expansion is 90% or greater of the supply time T2 (seconds) of the microwave pulse 51. For example, the applying time (T2−T11) of the negative applying voltage VC for usual sheath layer expansion is 982 (microseconds). That is, in one microwave pulse 51, the voltage value of the negative-bias voltage pulse 62 changes in order of the negative applying voltage VA ('0V'), the negative applying voltage VB for initial sheath layer expansion and the negative applying voltage VC for usual sheath layer expansion.

Therefore, in addition to the applying timing of the microwave pulse 51, the delay time T1 (seconds) of the negative-bias voltage pulse 62, the applying time (T11−T1) (seconds) of the negative applying voltage VB for initial sheath layer expansion, the applying start time T11 (seconds) of the negative applying voltage VC for usual sheath layer expansion, the applying time (T2−T11) (seconds) of the negative applying voltage VC for usual sheath layer expansion, and the applying ending time T2 (seconds) of the negative applying voltage VC for usual sheath layer expansion are stored in the ROM 33 or HDD 34. Accordingly, according to the film forming device 61 of the second illustrative embodiment, in S11, the initial applying voltage VA ('0V'), the negative applying voltage VB for initial sheath layer expansion, and the negative applying voltage VC for usual sheath layer expansion are read out from the ROM 33 or HDD 34 and are stored in the RAM 32.

Sheath Thickness Control Processing 2

Subsequently, sub-processing of 'sheath thickness control processing 2' that is to executed by the CPU 31 in S24 will be described with reference to FIGS. 14 to 16.

Figure 15:
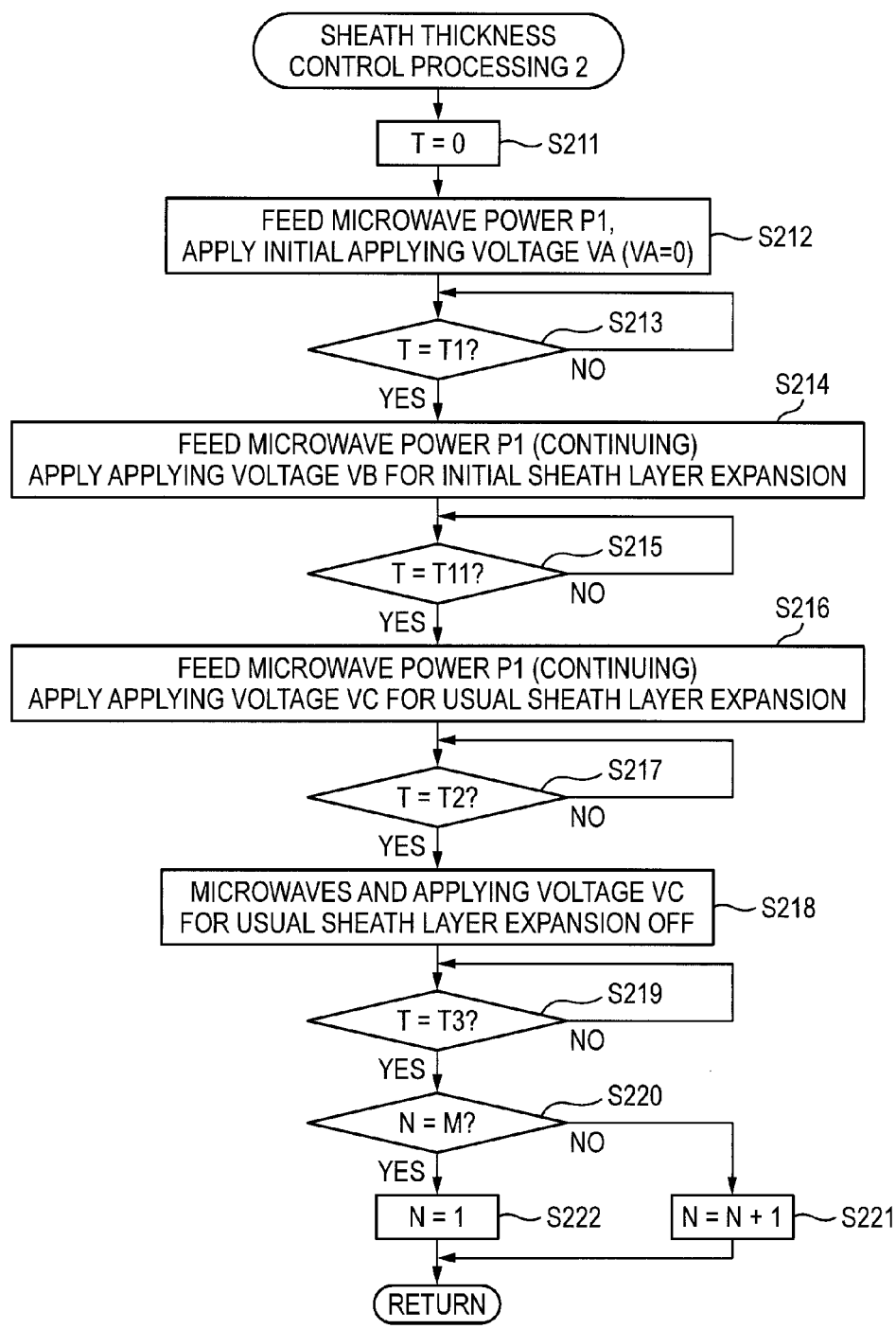
FIG. 15 is a sub-flowchart showing sub-processing of 'sheath thickness control processing 2' that is to be executed by the CPU of the controller according to the second illustrative embodiment.
Figure 16:
FIG. 16 illustrates a plasma extension state corresponding to FIG. 14.

As shown in FIG. 15, in S211, the CPU 31 executes the processing of S111. Then, in S212, the CPU 31 reads out the microwave output power P1 (kW) from the ROM 33 or HDD 34, and executes the processing of S112 by using the microwave output power P1 (kW) as the 'microwaves output (kW)' read from the applying voltage table 55. Also, the CPU 31 reads out the initial applying voltage VA ('0V') of the negative-bias voltage pulse 62, and transmits the initial applying voltage VA to the negative-voltage source 15.

The negative-voltage source 15 supplies 0 (V) to the negative-voltage pulse generating unit 16, in accordance with the received initial applying voltage VA, which is '0V'. The negative-voltage pulse generating unit 16 starts to apply the voltage 0(V) to the workpiece 8 through the negative voltage electrode 25. Therefore, when the plasma of the source gas and inert gas is ignited at the peripheral part of the microwave transmitting window 22 in the treatment chamber 2 by the supplied microwave pulses 51, as shown at the left end of FIG. 16, a sheath layer having a sheath thickness D1 (mm) is formed on the surfaces of the workpiece 8 and holder 9, as shown in FIG. 14. For example, since the sheath thickness D1 is 0.07 mm and does not expand, the microwaves do not propagate as the surface waves in the sheath layer. Meanwhile, in FIG. 16, the plasma 63 just indicates the position at which the plasma is generated and does not indicate the standing waves. Actually, the density distribution of the plasma is generated in correspondence to the standing waves.

Continuously, in S213, the CPU 31 executes the processing of S113. When it is determined that the measured time of the timer 35 reaches the delay time T1 (seconds) (S213: YES), the CPU 31 proceeds to processing of S214. In S214, the CPU 31 reads out the negative applying voltage VB for initial sheath layer expansion from the RAM 32, and transmits the negative applying voltage VB value for initial sheath layer expansion to the negative-voltage source 15. The CPU 31 transmits the negative-bias voltage pulse on signal to the negative-voltage pulse generating unit 16. For example, the negative applying voltage VB for initial sheath layer expansion is −400V (the sheath potential is −430V), and the applying time (T11−T1) is 10 (microseconds). Also, the microwave pulses 51 are continuously supplied from the microwave oscillator 12.

As a result, the negative-voltage source 15 supplies the negative applying voltage VB for initial sheath layer expansion to the negative-voltage pulse generating unit 16 in accordance with the received negative applying voltage VB value for initial sheath layer expansion. The negative-voltage pulse generating unit 16 starts to apply the negative-bias voltage pulse 62 of the applying time (T11−T1) (seconds) to the workpiece 8 through the negative voltage electrode 25 with the supplied negative applying voltage VB for initial sheath layer expansion, in conformity to processing of S216 (which will be described later).

Accordingly, as shown in FIG. 14, a sheath layer having a sheath thickness D2 (mm) is formed on the surfaces of the workpiece 8 and holder 9. For example, the sheath thickness D2 is 0.57 mm. Also, at the same time, as shown in the center of FIG. 16, the microwaves propagate as the surface waves in the sheath layer 65 formed and expanded on the surfaces of the workpiece 8 and holder 9, so that the surface wave excited plasma 66, which is the high density plasma, is generated along the surfaces of the workpiece 8 and holder 9. That is, since the sheath layer 65 sufficiently expands and the microwaves can easily propagate as the surface waves, the stable high density plasma is generated towards the tip of the workpiece 8. Thereby, the film formation of a DLC film on the surface of the workpiece 8 also starts.

Continuously, in S215, the CPU 31 executes determination processing of determining whether the measured time of the timer 35 reaches the applying start time T11 (seconds) of the negative applying voltage VC for usual sheath layer expansion, i.e., the applying timing of the negative applying voltage VC for usual sheath layer expansion. When it is determined that the measured time of the timer 35 does not reach the applying start time T11 (seconds) of the negative applying voltage VC for usual sheath layer expansion (S215: NO), the CPU 31 again executes the processing of S215.

On the other hand, when it is determined that the measured time of the timer 35 reaches the applying start time T11 (seconds) of the negative applying voltage VC for usual sheath layer expansion (S215: YES), the CPU 31 proceeds to processing of S216. In S216, the CPU 31 reads out the negative applying voltage VC value for usual sheath layer expansion from the RAM 32 and transmits the same to the negative-voltage source 15. The CPU 31 transmits the negative-bias voltage pulse on signal to the negative-voltage pulse generating unit 16. For example, the negative applying voltage VC for usual sheath layer expansion is −200V (the sheath potential is −230V), and the applying time (T2−T11) is 982 (microseconds). Also, the microwave pulses 51 are continuously supplied from the microwave oscillator 12.

As a result, the negative-voltage source 15 supplies the negative applying voltage VC for usual sheath layer expansion to the negative-voltage pulse generating unit 16, in accordance with the received negative applying voltage VC value for usual sheath layer expansion. The negative-voltage pulse generating unit 16 applies the negative-bias voltage pulse 62 of the applying time (T2−T11) (seconds) to the workpiece 8 through the negative voltage electrode 25 with the supplied negative applying voltage VC for usual sheath layer expansion, in conformity to processing of S218 (which will be described later).

Therefore, as shown in FIG. 14, a sheath layer having a sheath thickness D3 (mm) is formed on the surfaces of the workpiece 8 and holder 9. For example, the sheath thickness D3 is 0.4 mm. Also, at the same time, as shown at the right end of FIG. 16, the microwaves propagate as the surface waves in the sheath layer 67 formed on the surfaces of the workpiece 8 and holder 9, and the surface wave excited plasma 66, which is the high density plasma, is generated along the surfaces of the workpiece 8 and holder 9. Thereby, a DLC film is formed on the surface of the workpiece 8.

Continuously, in S217, the CPU 31 executes the processing of S115. When it is determined that the measured time of the timer 35 reaches the supply time T2 (seconds) of the microwave pulse 51 (S217: YES), the CPU 31 proceeds to processing of S218. In S218, the CPU 31 executes the processing of S116. Continuously, in S219, the CPU 31 executes the processing of S117. When it is determined that the measured time of the timer 35 reaches the period T3 (seconds) of the microwave pulse 51 (S219: YES), the CPU 31 proceeds to processing of S220.

In S220, the CPU 31 reads out the total number of applying times M from the ROM 33 or HDD 34, and executes determination processing of determining whether the count value N of the sequential counter reaches the total number of applying times M. When it is determined that the count value N of the sequential counter does not reach the total number of applying times M (S220: NO), the CPU 31 proceeds to processing of S221. In S221, the CPU 31 executes the processing of S119. On the other hand, when it is determined that the count value N of the sequential counter reaches the total number of applying times M (S220: YES), the CPU 31 proceeds to processing of S222. In S222, the CPU 31 executes the processing of S120.

On the other hand, in S219, when it is determined that the measured time of the timer 35 reaches the period T3 (seconds) of the microwave pulse 51 (S219: YES), the CPU 31 might as well end the sub-processing without executing the processing of S220 to S222, returns to the main flowchart and proceeds to the processing of S25.

As described above, according to the film forming device 61 of the second illustrative embodiment, the CPU 31 is configured to change the negative-bias voltage pulse 62 in order of the negative applying voltage VA ('0V'), the negative applying voltage VB for initial sheath layer expansion and the negative applying voltage VC for usual sheath layer expansion, for the delay time T1 (second), the applying time (T11−T1) (seconds) and the applying time (T2−T11) (second), respectively, during the supply time T2 (seconds) of each pulse of the microwave pulses 51.

Thereby, after generating the plasma at the periphery of the plasma transmitting window 22, it is possible to generate the sheath layer 65 having a large sheath thickness and to rapidly extend the surface wave excited plasma by applying the negative applying voltage VB for initial sheath layer expansion to the workpiece 8. Thereafter, it is possible to generate the sheath layer 67 having a predetermined thickness on the surface of the workpiece 8 and to stably generate the surface wave excited plasma 66 by applying the negative applying voltage VC for usual sheath layer expansion to the workpiece 8. Therefore, the variation of the film characteristics such as the film thickness, the film hardness and the like resulting from the destabilization of the plasma is not caused, and the film characteristics of the DLC film formed on the surface of the workpiece 8, such as the film thickness, the film hardness and the like, can be made to be uniform. Also, it is possible to extend the surface wave excited plasma at high speed along the surface of the workpiece 8, so that it is possible to improve the followability to the high speed film formation by the MVP method.

Third Illustrative Embodiment

Figure 18:
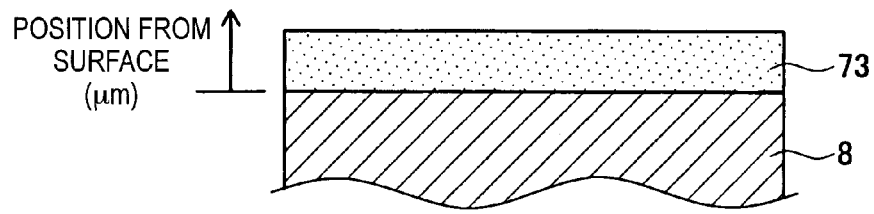
FIG. 18 illustrates a film formation state with respect to FIG. 17.
Figure 19:
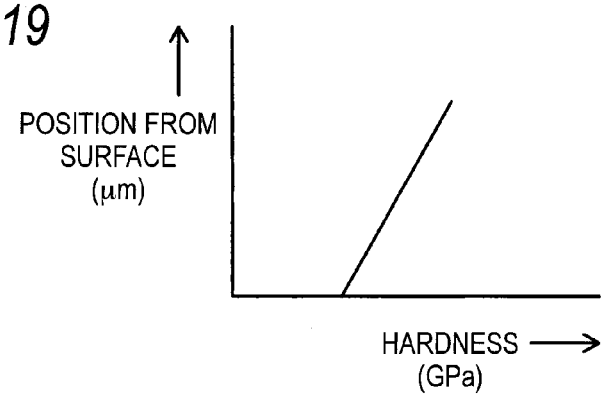
FIG. 19 illustrates a change in hardness in a thickness direction of a DLC film of FIG. 17.

Subsequently, a film forming device 71 according to a third illustrative embodiment will be described with reference to FIGS. 17 to 19. Meanwhile, in below descriptions, the same reference numerals as the configurations of the film forming device 1 of the first illustrative embodiment shown in FIGS. 1 to 13 indicate the same or equivalent configurations as or to those of the film forming device 1 of the first illustrative embodiment.

A schematic configuration of the film forming device 71 according to the third illustrative embodiment is substantially the same as the film forming device 1 of the first illustrative embodiment.

Figure 17:
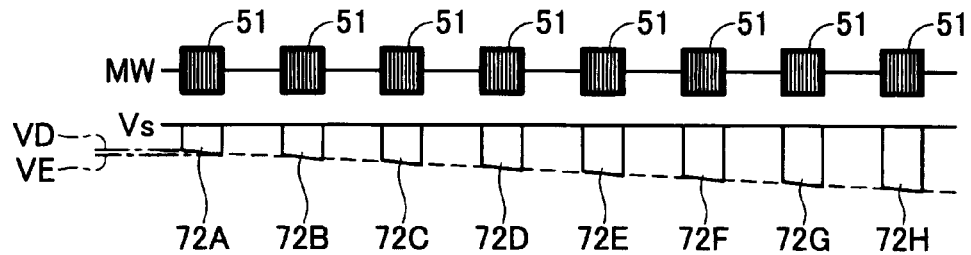
FIG. 17 illustrates an example where different negative bias voltages are applied every one pulse of the microwave pulses in a film forming device according to a third illustrative embodiment.

However, as shown in FIG. 17, in the 'negative bias voltage (V)' of the applying voltage table 55 shown in FIG. 10, negative applying voltage values of negative-bias voltage pulses 72A, 72B, 72C, and so on, which are set to gradually increase the sheath thickness of the sheath layer 42 within a predetermined range, are stored with being associated with the 'sequence' of supplying the microwave pulse 51. Also, the negative applying voltage values of the respective negative-bias voltage pulses 72A, 72B, 72C, and so on, are set to gradually increase from an initial voltage VD to a final voltage VE so that the negative applying voltage values continuously change.

For example, the negative applying voltages, which are set to gradually increase whenever applying the initial voltage VD and the final voltage VE of the negative applying voltage from about −200V (the sheath potential is −230V) to about −358V (the sheath potential is −388V) so that the sheath thickness of the sheath layer 42 gradually increases from about 0.4 mm to about 0.57 mm at the plasma electron density $10^{12}$ cm$^{-3}$, are stored with being associated with the 'sequence' of supplying the microwave pulse 51.

Therefore, an absolute value of the negative applying voltage, which is to be applied to the workpiece 8 through the negative voltage electrode 25 in S114 as the CPU 31 executes the sub-processing of the 'sheath thickness control processing 1' in S24 of the 'film forming processing', gradually increases not only whenever the negative applying voltage is applied but also during the application of negative applying voltage. Accordingly, the sheath thickness of the sheath layer 42 formed on the surface of the workpiece 8 gradually increases not only whenever the negative applying voltage is applied but also during the application of negative applying voltage, so that the DLC film is formed on the surface of the workpiece 8.

A change of the film hardness in a DLC film 73 formed as described above will be described with reference to FIGS. 18 and 19. As shown in FIGS. 18 and 19, the film hardness in the DLC film 73 formed on the surface of the workpiece 8 gradually increases as the DLC film gets away from the surface of the workpiece 8 outwardly in the film thickness direction. That is, the film hardness in the formed DLC film 73 gradually increases as the sheath thickness of the sheath layer 42 formed on the surface of the workpiece 8 increases.

As described above, according to the film forming device 71 of the third illustrative embodiment, the CPU 31 is configured to set the absolute values of the negative applying voltages of the negative-bias voltage pulse 72A, 72B, 72C, . . . so as to gradually increase so that the sheath thickness of the sheath layer 42 gradually increases within a predetermined range, in association with the 'sequence' of supplying one pulse of the microwave pulses 51. Thereby, the film hardness in the DLC film 73 formed on the surface of the workpiece 8 gradually increases as the DLC film becomes more distant outwardly in the film thickness direction.

Also, since a lower layer part of the DLC film 73 contacting the workpiece 8 is formed with the low negative applying voltage, the film hardness of the film formed by the low negative applying voltage decreases and a hardness difference from the hardness of the workpiece 8 is reduced.

As a result, it is possible to increase the adhesiveness of the DLC film 73 to the workpiece 8. Also, since the negative applying voltage gradually increases even within one pulse of the respective negative-bias voltage pulses 72A, 72B, 72C, and so on, it is possible to continuously increase the film hardness in the DLC film 73 formed on the surface of the workpiece 8 outwardly in the film thickness direction, as compared to a DLC film to be formed according to a film forming device 81 of a fourth illustrative embodiment (which will be described later). Also, according to the third illustrative embodiment, since the voltage values are different within one pulse, the hardness difference of the film to be formed by the one pulse is reduced. Therefore, when the one pulse is applied several times, it is possible to form a film having improved the adhesiveness on the workpiece 8.

In the meantime, the CPU 31 may be configured to set the absolute values of the negative applying voltages of the negative-bias voltage pulse 72A, 72B, 72C, and so on, so as to gradually decrease so that the sheath thickness of the sheath layer 42 gradually decreases within a predetermined range, in association with the 'sequence' of supplying one pulse of the microwave pulses 51. Thereby, the film hardness of the DLC film 73 formed on the surface of the workpiece 8 can be made to gradually decrease as the DLC film becomes more distant outwardly in the film thickness direction, so that it is possible to improve the conformability of the DLC film 73 formed on the surface of the workpiece 8 to a sliding contact member.

Fourth Illustrative Embodiment

Subsequently, a film forming device 81 according to a fourth illustrative embodiment will be described with reference to FIGS. 20 and 21. Meanwhile, in below descriptions, the same reference numerals as the configurations of the film forming device 71 of the third illustrative embodiment indicate the same or equivalent configurations as or to those of the film forming device 71 of the third illustrative embodiment.

A schematic configuration of the film forming device 81 according to the fourth illustrative embodiment is substantially the same as the film forming device 71 of the third illustrative embodiment.

Figure 20:
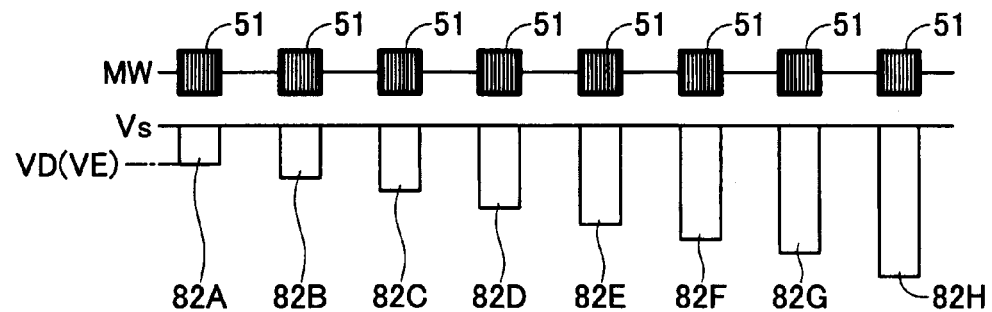
FIG. 20 illustrates an example where different negative bias voltages are applied every one pulse of the microwave pulses in a film forming device according to a fourth illustrative embodiment.

However, as shown in FIG. 20, in the 'negative bias voltage (V)' of the applying voltage table 55 shown in FIG. 10, negative applying voltage values of negative-bias voltage pulses 82A, 82B, 82C, and so on, which are set to gradually increase the sheath thickness of the sheath layer 42 within a predetermined range, are stored with being associated with the 'sequence' of supplying the microwave pulse 51. Also, the negative applying voltages of the respective bias voltage pulses 82A, 82B, 82C, and so on, are set to be constant from an initial voltage VD to a final voltage VE so that the negative applying voltages stepwise change.

Therefore, an absolute value of the negative applying voltage, which is to be applied to the workpiece 8 through the negative voltage electrode 25 in S114 as the CPU 31 executes the sub-processing of the 'sheath thickness control processing 1' in S22 of the 'film forming processing', gradually increases whenever the negative applying voltage is applied. Accordingly, the sheath thickness of the sheath layer 42 formed on the surface of the workpiece 8 gradually increases whenever the negative applying voltage is applied, so that the DLC film is formed. Thereby, according to the film forming device 81 of the fourth illustrative embodiment, it is possible to gradually increase the film hardness in the DLC film 73 formed on the surface of the workpiece 8 as the DLC film becomes more distant outwardly in the film thickness direction, thereby improving the adhesiveness of the DLC film 73 on the workpiece 8, like the film forming device 71 of the third illustrative embodiment.

Figure 21:
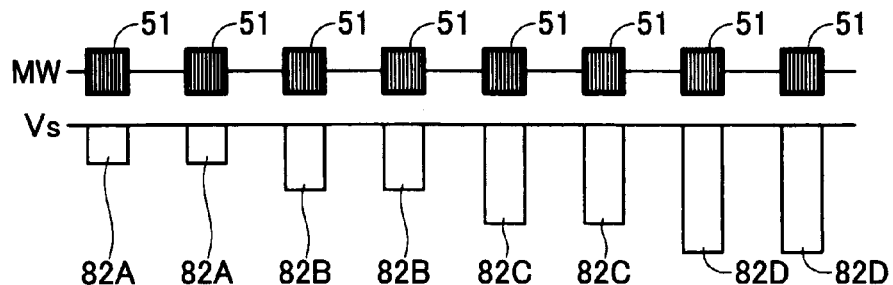
FIG. 21 illustrates an example where different negative bias voltages are applied every two pulses of the microwave pulses in a film forming device according to the fourth illustrative embodiment.

In the meantime, as shown in FIG. 21, the CPU 31 may be configured to increase the negative bias voltage, which is to be applied to the workpiece 8, every two pulses, for example. That is, the negative bias voltage to be applied to the workpiece 8 may be increased every a plurality of pulses.

Fifth Illustrative Embodiment

Subsequently, a film forming device 91 according to a fifth illustrative embodiment will be described with reference to FIG. 22. Meanwhile, in below descriptions, the same reference numerals as the configurations of the film forming device 71 of the third illustrative embodiment indicate the same or equivalent configurations as or to those of the film forming device 71 of the third illustrative embodiment.

A schematic configuration of the film forming device 91 according to the fifth illustrative embodiment is substantially the same as the film forming device 71 of the third illustrative embodiment.

Figure 22:
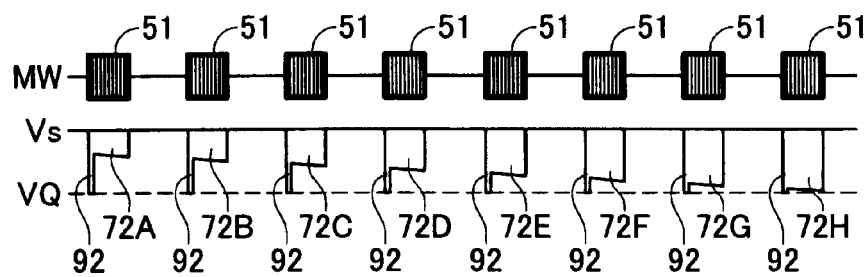
FIG. 22 illustrates an example where different negative bias voltages are applied every one pulse of the microwave pulses in a film forming device according to a fifth illustrative embodiment.

However, as shown in FIG. 22, in the 'negative bias voltage (V)' of the applying voltage table 55 shown in FIG. 10, the applying voltages for usual sheath layer expansion, which are negative applying voltage values of negative-bias voltage pulses 72A, 72B, 72C, and so on, set to gradually increase the sheath thickness of the sheath layer 42 within a predetermined range, are stored with being associated with the 'sequence' of supplying each pulse of the microwave pulses 51. Also, a negative applying voltage VQ for initial sheath layer expansion, which is to be applied for an applying time T22 (seconds) before applying each of the bias voltage pulses 72A, 72B, 72C, is stored with being associated with the 'sequence' of supplying the microwave pulses 51. For example, the applying time T22 is 10 (microseconds), and the negative applying voltage VQ for initial sheath layer expansion is −400V (the sheath potential is −430V).

Therefore, as shown in FIG. 22, regarding the negative-bias voltage pulse, which is to be applied to the workpiece 8 through the negative voltage electrode 25 in S114 as the CPU 31 executes the sub-processing of the 'sheath thickness control processing 1' in S24 of the 'film forming processing', whenever it is applied, an applying voltage pulse 92 for initial sheath layer expansion of the negative applying voltage VQ for initial sheath layer expansion is applied for the applying time T22 (seconds) and then an applying voltage for usual sheath layer expansion of each of the bias voltage pulses 72A, 72B, 72C, and so on, gradually increasing is applied. Accordingly, when the applying voltage pulse 92 for initial sheath layer expansion is applied to the workpiece 8, the plasma is extended at high speed by the sheath layer 42 formed along the surface of the workpiece 8 and then the applying voltage for usual sheath layer expansion of each of the bias voltage pulses 72A, 72B, 72C, and so on, gradually increasing is applied.

Thereby, according to the film forming device 91 of the fifth illustrative embodiment, it is possible to gradually increase the film hardness in the DLC film 73 formed on the surface of the workpiece 8 as the DLC film becomes more distant outwardly in the film thickness direction, thereby improving the adhesiveness of the DLC film 73 on the workpiece 8, like the film forming device 71 of the third illustrative embodiment. Also, it is possible to stably extend the surface wave excited plasma at high speed along the surface of the workpiece 8, thereby further improving the followability to the high speed film formation by the MVP method.

Sixth Illustrative Embodiment

Subsequently, a film forming device 95 according to a sixth illustrative embodiment will be described with reference to FIGS. 23 and 24. Meanwhile, in below descriptions, the same reference numerals as the configurations of the film forming device 1 of the first illustrative embodiment shown in FIGS. 1 to 13 indicate the same or equivalent configurations as or to those of the film forming device 1 of the first illustrative embodiment.

A schematic configuration of the film forming device 95 according to the sixth illustrative embodiment is substantially the same as the film forming device 1 of the first illustrative embodiment.

Figure 23:
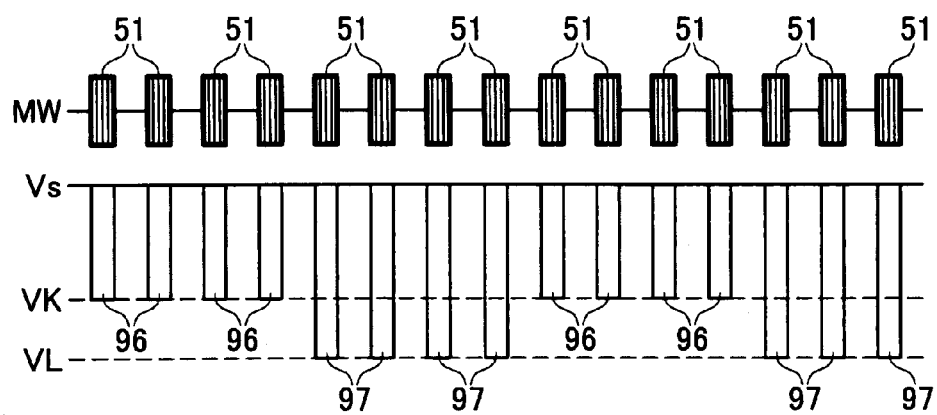
FIG. 23 illustrates an example where different negative bias voltages are applied every one pulse of the microwave pulses in a film forming device according to a sixth illustrative embodiment.
Figure 24:
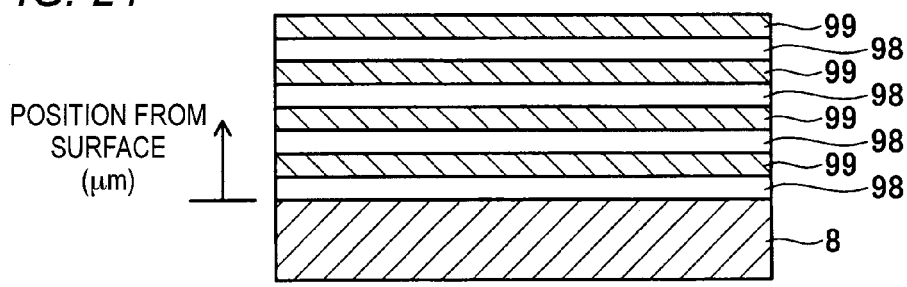
FIG. 24 illustrates a film formation state with respect to FIG. 23.

However, as shown in FIG. 23, in the 'negative bias voltage (V)' of the applying voltage table 55 shown in FIG. 10, a negative applying voltage VK of negative-bias voltage pulses 96, which are to be applied to the negative voltage electrode 25, and a negative applying voltage VL having an absolute value greater than the negative applying voltage VK of negative-bias voltage pulses 97, which are to be applied to the negative voltage electrode 25, are alternately and repeatedly stored every a plurality of supplying times of the microwave pulses 51, for example, every four times, in association with the 'sequence' of supplying the microwave pulse 51. For example, the negative applying voltage VK is −200V (the sheath potential is −230V), and the negative applying voltage VL is −400V (the sheath potential is −430V).

Therefore, as shown in FIG. 23, regarding the negative-bias voltage pulse, which is to be applied to the workpiece 8 through the negative voltage electrode 25 in S114 as the CPU 31 executes the sub-processing of the 'sheath thickness control processing 1' in S24 of the 'film forming processing', the negative-bias voltage pulses of the negative applying voltage VK and the negative-bias voltage pulses 97 of the negative applying voltage VL are alternately and repeatedly applied every a plurality of supplying times of the microwave pulses 51, for example, every four times. Accordingly, regarding the sheath thickness of the sheath layer 42 to be formed on the surface of the workpiece 8, the sheath layer 42 having a small sheath thickness and the sheath layer 42 having a large sheath thickness are alternately and repeatedly formed every a plurality of supplying times of the microwave pulses 51, for example, every four times, so that a DLC film is formed on the surface of the workpiece 8.

Here, an example of the DLC film formed on the surface of the workpiece 8 will be described with reference to FIG. 24. As shown in FIG. 24, a low-hardness DLC film 98, which is formed by applying the negative-bias voltage pulse 96 a plurality of times, for example, four times, and a high-hardness DLC film 99, which is formed by applying the negative-bias voltage pulse 97 a plurality of times, for example, four times, are alternately stacked with predetermined film thicknesses on the surface of the workpiece 8.

Thereby, according to the film forming device 95 of the sixth illustrative embodiment, it is possible to improve the adhesiveness of the respective DLC films 98, 99 to the workpiece 8 by alternately stacking the low-hardness DLC film 98 and the high-hardness DLC film 99 on the surface of the workpiece 8.

As described above, according to the present invention, there is provided a film forming device including a microwave supplying unit configured to supply microwaves for generating plasma along a treatment surface of a conductive workpiece; a negative voltage applying unit configured to apply to the workpiece a negative bias voltage for expanding a sheath layer thickness along the treatment surface of the workpiece, and a controller configured to control the microwave supplying unit and the negative voltage applying unit, wherein the microwave supplying unit has a microwave transmitting window configured to propagate the supplied microwaves to the expanded sheath layer, and wherein the controller is configured to control the microwave supplying unit and the negative voltage applying unit so that a sheath thickness of the sheath layer changes while supplying of the microwaves.

According to the film forming device, while supplying of the microwaves by the microwave supplying unit, the sheath layer is formed and the sheath thickness of the sheath layer is changed, so that it is possible to change a distribution of standing waves generated by the microwaves propagating as surface waves with a high energy density in the sheath layer. Thereby, it is possible to change a plasma density distribution of the high density plasma of the source gas plasma-excited by the surface waves and to uniformize the film characteristics of the film formed on the surface of the workpiece, such as a film thickness, film harness and the like.

Also, in the film forming device of the present invention, the controller may be configured to control the negative voltage applying unit so that the sheath thickness changes by changing a voltage value of the negative bias voltage to be applied to the workpiece, while supplying of the microwaves by the microwave supplying unit.

According to the above film forming device, while supplying of the microwaves by the microwave supplying unit, the sheath thickness is changed by changing the voltage value of the negative bias voltage to be applied to the workpiece. Therefore, it is possible to change the sheath thickness of the sheath layer at high speed. Thereby, it is possible to rapidly change the distribution of the standing waves generated by the microwaves propagating as the surface waves in the sheath layer, thereby improving the followability to the high speed film formation.

Also, in the film forming device of the present invention, the controller may be configured to control the negative voltage applying unit so that negative bias voltages having a plurality of types of pulse shapes of which voltage values are different are sequentially applied to the workpiece to repeat expansion and reduction of the sheath thickness, while supplying of the microwaves by the microwave supplying unit.

According to the above film forming device, while supplying of the microwaves by the microwave supplying unit, the negative bias voltages having a plurality of types of pulse shapes of which voltage values are different are sequentially applied to the workpiece to repeat expansion and reduction of the sheath thickness. Thereby, it is possible to uniformize the distribution change of the standing waves generated by the microwaves propagating as the surface waves with a high energy density in the sheath layer, so that it is possible to further uniformize the film characteristics of the film formed on the surface of the workpiece, such as a film thickness, film harness and the like.

Also, in the film forming device of the present invention, the controller may be configured to control the negative voltage applying unit so that a voltage value of the negative bias voltage to be applied to the workpiece gradually changes every one or more pulses, while supplying of the microwaves by the microwave supplying unit.

According to the above film forming device, while supplying of the microwaves by the microwave supplying unit, the voltage value of the negative bias voltage to be applied to the workpiece gradually changes every one or more pulses. Thereby, it is possible to form a film having desired film characteristics on the surface of the workpiece.

For example, when the voltage value of the negative bias voltage is made to gradually increase every one or more pulses, the hardness of the film formed on the surface of the workpiece gradually increases, so that it is possible to improve the adhesiveness of the film to the workpiece. Also, when the voltage value of the negative bias voltage is made to gradually decrease every one or more pulses, the hardness of the film formed on the surface of the workpiece gradually decreases, so that it is possible to improve the conformability to a sliding contact member.

Also, in the film forming device of the present invention, the controller may change a voltage value of the negative bias voltage based on a wavelength of surface waves propagating along the sheath layer in a case where a shape of a negative voltage electrode configured to apply the negative bias voltage to the workpiece forms a discontinuous part in a propagation direction along which the microwaves propagate as the surface waves in the sheath layer.

According to the above film forming device, when the shape of the negative voltage electrode configured to apply the negative bias voltage to the workpiece forms a discontinuous part in the propagation direction along which the microwaves propagate along the sheath layer, the voltage value of the negative bias voltage is changed based on a wavelength of the surface waves propagating along the sheath layer. Thereby, it is possible to change the distribution of the standing waves, so that it is possible to further uniformize the film characteristics of the film formed on the surface of the workpiece, such as a film thickness, film harness and the like.

Also, in the film forming device of the present invention, the microwave supplying unit may be configured to supply microwaves having a pulse shape to the workpiece, and the controller may be configured to control the negative voltage applying unit so that the sheath thickness changes by changing a voltage value of the negative bias voltage within one pulse of the microwaves.

According to the above film forming device, the sheath thickness of the sheath layer is changed by changing the voltage value of the negative bias voltage within one pulse of the microwaves having a pulse shape. Thereby, it is possible to extend the plasma by the sheath layer generated along the surface of the workpiece at high speed. Also, when the plasma is stabilized, it is possible to form a film with a predetermined sheath thickness on the surface of the workpiece.

Also, according to the present invention, a film forming method to be executed by a film forming device comprising a microwave supplying unit configured to supply microwaves to a conductive workpiece through a microwave transmitting window, a negative voltage applying unit configured to apply a negative bias voltage to the workpiece and a controller configured to execute the film forming method, the film forming method comprising: supplying microwaves for generating plasma along a treatment surface of the workpiece through the microwave transmitting window; applying to the workpiece a negative bias voltage for expanding a sheath layer thickness along the treatment surface of the workpiece through the negative voltage applying unit; propagating the microwaves supplied through the microwave transmitting window to the expanded sheath layer; and controlling the microwave supplying unit and the negative voltage applying unit, wherein the controller is configured to control the microwave supplying unit and the negative voltage applying unit while supplying of the microwaves so that a sheath thickness of the sheath layer changes.

According to the film forming method, while supplying of the microwaves by the microwave supplying unit, the sheath layer is formed and the sheath thickness of the sheath layer is changed, so that it is possible to change a distribution of standing waves generated by the microwaves propagating as surface waves with a high energy density in the sheath layer. Thereby, it is possible to change a plasma density distribution of the high density plasma of the source gas plasma-excited by the surface waves and to uniformize the film characteristics of the film formed on the surface of the workpiece, such as a film thickness, film harness and the like.

Also, according to the present invention, a non-transitory computer-readable medium having instructions to control a computer of a film forming device, the film forming device comprising a microwave supplying unit configured to supply microwaves to a conductive workpiece through a microwave transmitting window, and a negative voltage applying unit configured to apply a negative bias voltage to the workpiece, the instructions, when executed by the computer, control the computer to perform operations comprising: supplying microwaves for generating plasma along a treatment surface of the workpiece through the microwave transmitting window; applying to the workpiece a negative bias voltage for expanding a sheath layer thickness along the treatment surface of the workpiece through the negative voltage applying unit; propagating the microwaves supplied through the microwave transmitting window to the expanded sheath layer, and controlling the microwave supplying unit and the negative voltage applying unit, wherein the instructions causes the computer to control the microwave supplying unit and the negative voltage applying unit while supplying of the microwaves so that a sheath thickness of the sheath layer changes.

According to the instructions to control a computer of a film forming device, while supplying of the microwaves by the microwave supplying unit, the sheath layer is formed and the sheath thickness of the sheath layer is changed, so that it is possible to change a distribution of standing waves generated by the microwaves propagating as surface waves with a high energy density in the sheath layer. Thereby, the computer can change a plasma density distribution of the high density plasma of the source gas plasma-excited by the surface waves and to uniformize the film characteristics of the film formed on the surface of the workpiece, such as a film thickness, film harness and the like.

In the meantime, the present invention is not limited to the first to sixth illustrative embodiments, and can be variously improved and modified without departing from the gist of the present invention. Modified embodiments are exemplified, as follows.

(A) For example, in the film forming device 81 of the fourth illustrative embodiment, the absolute values of the negative applying voltages of the negative-bias voltage pulses 82A, 82B, 82C, and so on, may be set to gradually decrease so that the sheath thickness of the sheath layer 42 gradually decreases within a predetermined range, in association with the 'sequence' of supplying one pulse of the microwave pulses 51. Thereby, the film hardness of the DLC film 73 formed on the surface of the workpiece 8 can be made to gradually decrease as the DLC film becomes more distant outwardly in the film thickness direction, so that it is possible to improve the conformability of the DLC film 73 formed on the surface of the workpiece 8 to a sliding contact member.

(B) For example, in the film forming device 81 of the fourth illustrative embodiment, the absolute values of the negative applying voltages of the negative-bias voltage pulses 82A, 82A, 82B, 82B, 82C, 82C, and so on, set every two pulses may be set to gradually decrease every two pulses so that the sheath thickness of the sheath layer 42 gradually decreases within a predetermined range, in association with the 'sequence' of supplying one pulse of the microwave pulses 51. Thereby, the film hardness of the DLC film 73 formed on the surface of the workpiece 8 can be made to gradually decrease as the DLC film becomes more distant outwardly in the film thickness direction, so that it is possible to improve the conformability of the DLC film 73 formed on the surface of the workpiece 8 to a sliding contact member.

(C) For example, in the film forming device 91 of the fifth illustrative embodiment, the absolute values of the negative applying voltages of the negative-bias voltage pulses 72A, 72B, 72C, and so on, may be set to gradually decrease so that the sheath thickness of the sheath layer 42 gradually decreases within a predetermined range, in association with the 'sequence' of supplying one pulse of the microwave pulses 51. Thereby, the film hardness of the DLC film 73 formed on the surface of the workpiece 8 can be made to gradually decrease as the DLC film becomes more distant outwardly in the film thickness direction, so that it is possible to improve the conformability of the DLC film 73 formed on the surface of the workpiece 8 to a sliding contact member.

(D) For example, according to the first to sixth illustrative embodiments, the workpiece 8 is held by the holder 9. However, the workpiece may be directly supported to the microwave transmitting window.

What is claimed is:

1. A film forming device comprising:
a microwave supplying unit configured to supply microwaves for generating plasma along a treatment surface of a workpiece, which is conductive;
a negative voltage applying unit connectable to the workpiece and configured to apply to the workpiece a negative bias voltage for expanding a sheath layer thickness along the treatment surface of the workpiece, and
a controller configured to control the microwave supplying unit and the negative voltage applying unit,
wherein the microwave supplying unit has a microwave transmitting window configured to propagate the supplied microwaves to the expanded sheath layer,
wherein the controller is configured to control the microwave supplying unit and the negative voltage applying unit while supplying of the microwaves so that a sheath thickness of the sheath layer changes,
wherein, while supplying of the microwaves by the microwave supplying unit, the controller controls the negative voltage applying unit so that the sheath thickness changes by changing a voltage value of the negative bias voltage to be applied to the workpiece, and
wherein, while supplying of the microwaves by the microwave supplying unit, the controller controls the negative voltage applying unit to apply negative bias voltages having a plurality of types of pulse shapes including a first pulse and a second pulse to the workpiece to repeat expansion or reduction of the sheath thickness, wherein the first pulse has a first voltage value and a second pulse has a second voltage value different from the first voltage value, and the first pulse and the second pulse are sequentially applied with an interval interposed between the first pulse and the second pulse.

2. The film forming device according to claim 1,
wherein, while supplying of the microwaves by the microwave supplying unit, the controller controls the negative voltage applying unit so that a voltage value of the negative bias voltage to be applied to the workpiece gradually changes every one or more pulses.

3. The film forming device according to claim 1,
wherein the controller changes a voltage value of the negative bias voltage based on a wavelength of surface waves propagating along the sheath layer in a case where a shape of a negative voltage electrode configured to apply the negative bias voltage to the workpiece forms a discontinuous part in a propagation direction along which the microwaves propagate as the surface waves in the sheath layer.

4. The film forming device according to claim 1,
wherein the microwave supplying unit is configured to supply microwaves having a pulse shape to the workpiece, and
wherein the controller is configured to control the negative voltage applying unit so that the sheath thickness changes by changing a voltage value of the negative bias voltage within one pulse of the microwaves.

5. A film forming device comprising:
a microwave supplying unit configured to supply microwaves for generating plasma along a treatment surface of a workpiece, which is conductive;
a negative voltage applying unit connectable to the workpiece and configured to apply to the workpiece a negative bias voltage for expanding a sheath layer thickness along the treatment surface of the workpiece, and
a controller configured to control the microwave supplying unit and the negative voltage applying unit,
wherein the microwave supplying unit has a microwave transmitting window configured to propagate the supplied microwaves to the expanded sheath layer,
wherein the controller is configured to control the microwave supplying unit and the negative voltage applying unit while supplying of the microwaves so that a sheath thickness of the sheath layer changes,
wherein, while supplying of the microwaves by the microwave supplying unit, the controller controls the negative voltage applying unit so that the sheath thickness changes by changing a voltage value of the negative bias voltage to be applied to the workpiece, and wherein, while supplying of the microwaves by the microwave supplying unit, the controller controls the negative voltage applying unit so that a voltage value of the negative bias voltage to be applied to the workpiece gradually changes every one or more pulses, wherein the negative bias voltage has a plurality of types of pulse shapes including a first pulse, a second pulse, and a third pulse, wherein the first pulse has a first voltage value, a second pulse has a second voltage value different from the first voltage value, and the third pulse has a third voltage value different from the first voltage value and the second value, and wherein the first pulse, the second pulse, and the third pulse are sequentially applied with an interval interposed therebetween.

6. The film forming device according to claim 5
wherein, while supplying of the microwaves by the microwave supplying unit, the controller controls the negative voltage applying unit so that negative bias voltages having a plurality of types of pulse shapes of which voltage values are different are sequentially applied to the workpiece to repeat expansion and reduction of the sheath thickness.

7. The film forming device according to claim 5,
wherein the controller changes a voltage value of the negative bias voltage based on a wavelength of surface waves propagating along the sheath layer in a case where a shape of a negative voltage electrode configured to apply the negative bias voltage to the workpiece forms a discontinuous part in a propagation direction along which the microwaves propagate as the surface waves in the sheath layer.

8. The film forming device according to claim 5,
wherein the microwave supplying unit is configured to supply microwaves having a pulse shape to the workpiece, and
wherein the controller is configured to control the negative voltage applying unit so that the sheath thickness changes by changing a voltage value of the negative bias voltage within one pulse of the microwaves.

9. The film forming device according to claim 5, wherein the second voltage value is larger than the first voltage value, and the third voltage value is larger than the second voltage value.

10. The film forming device according to claim 5, wherein the second voltage value is smaller than the first voltage value, and the third voltage value is smaller than the second voltage value.

* * * * *